US010269985B2

United States Patent
Ramkumar et al.

(10) Patent No.: US 10,269,985 B2
(45) Date of Patent: *Apr. 23, 2019

(54) RADICAL OXIDATION PROCESS FOR FABRICATING A NONVOLATILE CHARGE TRAP MEMORY DEVICE

(71) Applicant: Cypress Semiconductor Corporation, San Jose, CA (US)

(72) Inventors: Krishnaswamy Ramkumar, San Jose, CA (US); Sagy Charel Levy, Zichron Yaakov (IL); Jeong Soo Byun, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/605,231

(22) Filed: Jan. 26, 2015

(65) Prior Publication Data

US 2015/0187960 A1 Jul. 2, 2015

Related U.S. Application Data

(63) Continuation of application No. 13/539,458, filed on Jul. 1, 2012, now Pat. No. 8,940,645, which is a
(Continued)

(51) Int. Cl.
*H01L 29/792* (2006.01)
*H01L 21/28* (2006.01)
(Continued)

(52) U.S. Cl.
CPC .......... *H01L 29/7926* (2013.01); *B82Y 10/00* (2013.01); *H01L 21/022* (2013.01);
(Continued)

(58) Field of Classification Search
CPC ................. H01L 27/085; H01L 27/105; H01L 27/11563; H01L 27/11573; H01L 21/0214;
(Continued)

(56) References Cited

U.S. PATENT DOCUMENTS 4,257,832 A    3/1981   Schwabe et al.
4,395,438 A    7/1983   Chiang
(Continued)

FOREIGN PATENT DOCUMENTS

CN    1107254 A    8/1995
CN    1801478 A    7/2006
(Continued)

OTHER PUBLICATIONS

Japanese Office Action for Japanese Application No. 2013-549612 dated Aug. 4, 2015; 8 pages.
(Continued)

*Primary Examiner* — Thanh T Nguyen

(57) ABSTRACT

A memory device is described. Generally, the memory device includes a tunnel oxide layer overlying a channel connecting a source and a drain of the memory device formed in a substrate, a multi-layer charge storing layer overlying the tunnel oxide layer and a high-temperature-oxide (HTO) layer overlying the multi-layer charge storing layer. The multi-layer charge storing layer includes an oxygen-rich, first layer comprising a nitride on the tunnel oxide layer in which a composition of the first layer results in it being substantially trap free, and an oxygen-lean, second layer comprising a nitride on the first layer in which a composition of the second layer results in it being trap dense. The HTO layer includes an oxidized portion of the second layer. Other embodiments are also described.

14 Claims, 24 Drawing Sheets

Related U.S. Application Data continuation-in-part of application No. 12/197,466, filed on Aug. 25, 2008, now Pat. No. 8,318,608, which is a continuation of application No. 12/124,855, filed on May 21, 2008, now Pat. No. 8,283,261.

(60) Provisional application No. 60/940,139, filed on May 25, 2007, provisional application No. 60/986,637, filed on Nov. 9, 2007.

(51) Int. Cl.

| | |
|---|---|
| *H01L 29/423* | (2006.01) |
| *H01L 29/66* | (2006.01) |
| *H01L 21/02* | (2006.01) |
| *H01L 29/775* | (2006.01) |
| *H01L 29/06* | (2006.01) |
| *B82Y 10/00* | (2011.01) |
| *H01L 29/16* | (2006.01) |

(52) U.S. Cl.
CPC ...... *H01L 21/0214* (2013.01); *H01L 21/0217* (2013.01); *H01L 21/0234* (2013.01); *H01L 21/02164* (2013.01); *H01L 21/02238* (2013.01); *H01L 21/02252* (2013.01); *H01L 21/02271* (2013.01); *H01L 21/02326* (2013.01); *H01L 21/02332* (2013.01); *H01L 21/28282* (2013.01); *H01L 29/0669* (2013.01); *H01L 29/0673* (2013.01); *H01L 29/0676* (2013.01); *H01L 29/16* (2013.01); *H01L 29/4234* (2013.01); *H01L 29/66833* (2013.01); *H01L 29/775* (2013.01)

(58) Field of Classification Search
CPC ........... H01L 21/02164; H01L 21/0217; H01L 21/022; H01L 21/02238; H01L 21/02252; H01L 21/02271; H01L 21/02326; H01L 21/02332; H01L 21/0234; H01L 21/28282; H01L 29/0669; H01L 29/0673; H01L 29/0676; H01L 29/16; H01L 29/4234; H01L 29/66833; H01L 29/775; H01L 29/7926; B82Y 10/00
USPC ............................................ 257/66, 324–328
See application file for complete search history.

(56) References Cited

U.S. PATENT DOCUMENTS

| | | | |
|---|---|---|---|
| 4,490,900 A | 1/1985 | Chiu | |
| 4,543,707 A | 10/1985 | Ito et al. | |
| 4,667,217 A | 5/1987 | Janning | |
| 4,843,023 A | 6/1989 | Chiu et al. | |
| 4,870,470 A | 9/1989 | Bass et al. | |
| 5,179,038 A | 1/1993 | Kinney et al. | |
| 5,348,903 A | 9/1994 | Pfiester et al. | |
| 5,404,791 A | 4/1995 | Kervagoret | |
| 5,405,791 A | 4/1995 | Ahmad et al. | |
| 5,408,115 A | 4/1995 | Chang | |
| 5,464,783 A | 11/1995 | Kim et al. | |
| 5,500,816 A | 3/1996 | Kobayashi | |
| 5,543,336 A | 8/1996 | Enami et al. | |
| 5,550,078 A | 8/1996 | Sung | |
| 5,573,963 A | 11/1996 | Sung | |
| 5,773,343 A | 6/1998 | Lee et al. | |
| 5,793,089 A | 8/1998 | Fulford et al. | |
| 5,817,170 A | 10/1998 | Desu et al. | |
| 5,847,411 A | 12/1998 | Morii | |
| 5,861,347 A | 1/1999 | Maiti et al. | |
| 5,937,323 A | 8/1999 | Orczyk et al. | |
| 5,939,333 A | 8/1999 | Hurley et al. | |
| 5,972,765 A | 10/1999 | Clark et al. | |
| 5,972,804 A | 10/1999 | Tobin et al. | |
| 6,001,713 A | 12/1999 | Ramsbey et al. | |
| 6,015,739 A | 1/2000 | Gardner et al. | |
| 6,020,606 A | 2/2000 | Liao | |
| 6,023,093 A | 2/2000 | Gregor et al. | |
| 6,025,267 A | 2/2000 | Pey et al. | |
| 6,074,915 A | 6/2000 | Chen et al. | |
| 6,114,734 A | 9/2000 | Eklund | |
| 6,127,227 A | 10/2000 | Lin et al. | |
| 6,136,654 A | 10/2000 | Kraft et al. | |
| 6,140,187 A | 10/2000 | Debusk et al. | |
| 6,147,014 A | 11/2000 | Lyding et al. | |
| 6,150,286 A | 11/2000 | Sun et al. | |
| 6,153,543 A | 11/2000 | Chesire et al. | |
| 6,157,426 A | 12/2000 | Gu | |
| 6,162,700 A | 12/2000 | Hwang et al. | |
| 6,174,758 B1 | 1/2001 | Nachumovsky | |
| 6,174,774 B1 | 1/2001 | Lee | |
| 6,214,689 B1 | 4/2001 | Lim et al. | |
| 6,217,658 B1 | 4/2001 | Orczyk et al. | |
| 6,218,700 B1 | 4/2001 | Papadas | |
| 6,268,299 B1 | 7/2001 | Jammy et al. | |
| 6,277,683 B1 | 8/2001 | Pradeep et al. | |
| 6,287,913 B1 | 9/2001 | Agnello et al. | |
| 6,297,096 B1 | 10/2001 | Boaz | |
| 6,297,173 B1 | 10/2001 | Tobin et al. | |
| 6,321,134 B1 | 11/2001 | Henley et al. | |
| 6,335,288 B1 | 1/2002 | Kwan et al. | |
| 6,348,380 B1 | 2/2002 | Weimer et al. | |
| 6,365,518 B1 | 4/2002 | Lee et al. | |
| 6,399,484 B1 | 6/2002 | Yamasaki et al. | |
| 6,406,960 B1 | 6/2002 | Hopper et al. | |
| 6,429,081 B1 | 8/2002 | Doong et al. | |
| 6,433,383 B1 * | 8/2002 | Ramsbey et al. | ............ 257/315 |
| 6,440,797 B1 | 8/2002 | Wu et al. | |
| 6,444,521 B1 | 9/2002 | Chang et al. | |
| 6,445,030 B1 | 9/2002 | Wu et al. | |
| 6,461,899 B1 | 10/2002 | Kitakado et al. | |
| 6,462,370 B2 | 10/2002 | Kuwazawa | |
| 6,468,927 B1 | 10/2002 | Zhang et al. | |
| 6,469,343 B1 | 10/2002 | Miura et al. | |
| 6,518,113 B1 | 2/2003 | Buynoski | |
| 6,559,026 B1 | 5/2003 | Rossman et al. | |
| 6,573,149 B2 | 6/2003 | Kizilyalli et al. | |
| 6,586,343 B1 | 7/2003 | Ho et al. | |
| 6,586,349 B1 | 7/2003 | Jeon et al. | |
| 6,596,590 B1 | 7/2003 | Miura et al. | |
| 6,599,795 B2 | 7/2003 | Ogata | |
| 6,602,771 B2 | 8/2003 | Inoue et al. | |
| 6,610,614 B2 | 8/2003 | Niimi et al. | |
| 6,624,090 B1 | 9/2003 | Yu et al. | |
| 6,661,065 B2 | 12/2003 | Kunikiyo | |
| 6,670,241 B1 | 12/2003 | Kamal et al. | |
| 6,677,213 B1 | 1/2004 | Ramkumar et al. | |
| 6,709,928 B1 | 3/2004 | Jenne et al. | |
| 6,713,127 B2 | 3/2004 | Subramony et al. | |
| 6,717,860 B1 | 4/2004 | Fujiwara | |
| 6,730,566 B2 | 5/2004 | Niimi et al. | |
| 6,746,968 B1 | 6/2004 | Tseng et al. | |
| 6,768,160 B1 | 7/2004 | Li et al. | |
| 6,768,856 B2 | 7/2004 | Akwani et al. | |
| 6,774,433 B2 | 8/2004 | Lee et al. | |
| 6,787,419 B2 | 9/2004 | Chen et al. | |
| 6,818,558 B1 | 11/2004 | Rathor et al. | |
| 6,833,582 B2 | 12/2004 | Mine et al. | |
| 6,835,621 B2 | 12/2004 | Yoo et al. | |
| 6,867,118 B2 | 3/2005 | Noro | |
| 6,884,681 B1 | 4/2005 | Kamal et al. | |
| 6,903,422 B2 | 6/2005 | Goda et al. | |
| 6,906,390 B2 | 6/2005 | Nomoto et al. | |
| 6,912,163 B2 | 6/2005 | Zheng et al. | |
| 6,913,961 B2 | 7/2005 | Hwang | |
| 6,917,072 B2 | 7/2005 | Noguchi et al. | |
| 6,946,349 B1 | 9/2005 | Lee et al. | |
| 6,958,511 B1 | 10/2005 | Halliyal et al. | |
| 7,012,299 B2 | 3/2006 | Mahajani et al. | |
| 7,015,100 B1 | 3/2006 | Lee et al. | |
| 7,018,868 B1 | 3/2006 | Yang et al. | |
| 7,033,890 B2 | 4/2006 | Shone | |
| 7,033,957 B1 | 4/2006 | Shiraiwa et al. | |

(56) References Cited

U.S. PATENT DOCUMENTS

| | | |
|---|---|---|
| 7,042,054 B1 | 5/2006 | Ramkumar et al. |
| 7,045,424 B2 | 5/2006 | Kim et al. |
| 7,060,594 B2 | 6/2006 | Wang |
| 7,084,032 B2 | 8/2006 | Crivelli et al. |
| 7,098,154 B2 | 8/2006 | Yoneda |
| 7,112,486 B2 | 9/2006 | Cho et al. |
| 7,115,469 B1 | 10/2006 | Halliyal et al. |
| 7,172,940 B1 | 2/2007 | Chen et al. |
| 7,189,606 B2 | 3/2007 | Wang et al. |
| 7,230,294 B2 | 6/2007 | Lee et al. |
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,279,740 B2 | 10/2007 | Bhattacharyya et al. |
| 7,301,185 B2 | 11/2007 | Chen et al. |
| 7,312,496 B2 | 12/2007 | Hazama |
| 7,315,474 B2 | 1/2008 | Lue |
| 7,323,742 B2 | 1/2008 | Georgescu |
| 7,338,869 B2 | 3/2008 | Fukada et al. |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,425,491 B2 | 9/2008 | Forbes |
| 7,450,423 B2 * | 11/2008 | Lai ................ G11C 16/0466 257/315 |
| 7,463,530 B2 | 12/2008 | Lue et al. |
| 7,479,425 B2 | 1/2009 | Ang et al. |
| 7,482,236 B2 | 1/2009 | Lee et al. |
| 7,521,751 B2 | 4/2009 | Fujiwara |
| 7,535,053 B2 | 5/2009 | Yamazaki |
| 7,544,565 B2 | 6/2009 | Kwak et al. |
| 7,576,386 B2 | 8/2009 | Lue et al. |
| 7,588,986 B2 | 9/2009 | Jung |
| 7,601,576 B2 | 10/2009 | Suzuki et al. |
| 7,612,403 B2 | 11/2009 | Bhattacharyya |
| 7,636,257 B2 | 12/2009 | Lue |
| 7,642,585 B2 | 1/2010 | Wang et al. |
| 7,646,041 B2 | 1/2010 | Chae et al. |
| 7,646,637 B2 | 1/2010 | Liao |
| 7,670,963 B2 | 3/2010 | Ramkumar et al. |
| 7,688,626 B2 | 3/2010 | Lue et al. |
| 7,692,246 B2 | 4/2010 | Dreeskornfeld et al. |
| 7,713,810 B2 | 5/2010 | Hagemeyer et al. |
| 7,714,379 B2 | 5/2010 | Lee |
| 7,723,789 B2 | 5/2010 | Lin et al. |
| 7,737,488 B2 | 6/2010 | Lai et al. |
| 7,790,516 B2 | 9/2010 | Willer et al. |
| 7,811,890 B2 | 10/2010 | Hsu et al. |
| 7,879,738 B2 | 2/2011 | Wang |
| 7,910,429 B2 | 3/2011 | Dong et al. |
| 7,927,951 B2 | 4/2011 | Kim et al. |
| 7,948,799 B2 | 5/2011 | Lue et al. |
| 7,972,930 B2 | 7/2011 | Jang et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,071,453 B1 | 12/2011 | Ramkumar et al. |
| 8,093,128 B2 | 1/2012 | Koutny et al. |
| 8,143,129 B2 | 3/2012 | Ramkumar et al. |
| 8,163,660 B2 | 4/2012 | Puchner et al. |
| 8,222,688 B1 | 7/2012 | Jenne et al. |
| 8,264,028 B2 | 9/2012 | Lue et al. |
| 8,283,261 B2 | 10/2012 | Ramkumar |
| 8,315,095 B2 | 11/2012 | Lue et al. |
| 8,318,608 B2 | 11/2012 | Ramkumar et al. |
| 8,482,052 B2 | 7/2013 | Lue et al. |
| 8,633,537 B2 * | 1/2014 | Polishchuk et al. ........ 257/324 |
| 8,643,124 B2 | 2/2014 | Levy et al. |
| 8,710,578 B2 | 4/2014 | Jenne et al. |
| 8,859,374 B1 | 10/2014 | Polishchuk et al. |
| 8,860,122 B1 | 10/2014 | Polishchuk et al. |
| 8,940,645 B2 | 1/2015 | Ramkumar et al. |
| 8,993,453 B1 | 3/2015 | Ramkumar et al. |
| 9,093,318 B2 | 7/2015 | Polishchuk et al. |
| 9,306,025 B2 | 4/2016 | Polishchuk et al. |
| 9,349,824 B2 | 5/2016 | Levy et al. |
| 9,355,849 B1 | 5/2016 | Levy et al. |
| 9,449,831 B2 | 9/2016 | Levy et al. |
| 9,502,543 B1 | 11/2016 | Polishchuk et al. |
| 2001/0052615 A1 | 12/2001 | Fujiwara |
| 2002/0020890 A1 | 2/2002 | Willer |
| 2002/0048200 A1 | 4/2002 | Kuwazawa |
| 2002/0048893 A1 | 4/2002 | Kizilyalli et al. |
| 2002/0109138 A1 | 8/2002 | Forbes |
| 2002/0141237 A1 | 10/2002 | Goda et al. |
| 2002/0154878 A1 | 10/2002 | Akwani et al. |
| 2003/0030100 A1 | 2/2003 | Lee et al. |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0169629 A1 | 9/2003 | Goebel et al. |
| 2003/0183869 A1 | 10/2003 | Crivelli et al. |
| 2003/0222293 A1 | 12/2003 | Noro |
| 2003/0227049 A1 | 12/2003 | Sakakibara |
| 2003/0227056 A1 | 12/2003 | Wang et al. |
| 2004/0067619 A1 | 4/2004 | Niimi et al. |
| 2004/0071030 A1 | 4/2004 | Goda et al. |
| 2004/0094793 A1 | 5/2004 | Noguchi et al. |
| 2004/0104424 A1 | 6/2004 | Yamazaki |
| 2004/0129986 A1 | 7/2004 | Kobayashi et al. |
| 2004/0129988 A1 | 7/2004 | Rotondaro et al. |
| 2004/0173918 A1 | 9/2004 | Kamal et al. |
| 2004/0183091 A1 | 9/2004 | Hibino |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0227198 A1 | 11/2004 | Mitani et al. |
| 2004/0251489 A1 | 12/2004 | Jeon et al. |
| 2005/0026637 A1 | 2/2005 | Fischer et al. |
| 2005/0056892 A1 | 3/2005 | Seliskar |
| 2005/0062098 A1 * | 3/2005 | Mahajani ......... H01L 21/28185 257/324 |
| 2005/0070126 A1 | 3/2005 | Senzaki |
| 2005/0079659 A1 | 4/2005 | Duan et al. |
| 2005/0088889 A1 | 4/2005 | Lee et al. |
| 2005/0093054 A1 | 5/2005 | Jung |
| 2005/0098839 A1 | 5/2005 | Lee et al. |
| 2005/0110064 A1 | 5/2005 | Duan et al. |
| 2005/0116279 A1 | 6/2005 | Koh |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0227501 A1 | 10/2005 | Tanabe et al. |
| 2005/0230766 A1 | 10/2005 | Nomoto et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0008959 A1 | 1/2006 | Hagemeyer et al. |
| 2006/0017092 A1 | 1/2006 | Dong et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0192248 A1 | 8/2006 | Wang |
| 2006/0202261 A1 | 9/2006 | Lue et al. |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0228907 A1 | 10/2006 | Cheng et al. |
| 2006/0237803 A1 | 10/2006 | Zhu et al. |
| 2006/0261401 A1 | 11/2006 | Bhattacharyya |
| 2006/0281331 A1 | 12/2006 | Wang |

(56) References Cited

U.S. PATENT DOCUMENTS

| | | |
|---|---|---|
| 2006/0284236 A1 | 12/2006 | Bhattacharyya |
| 2007/0012988 A1 | 1/2007 | Bhattacharyya |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |
| 2007/0121380 A1 | 5/2007 | Thomas |
| 2007/0200168 A1 | 8/2007 | Ozawa et al. |
| 2007/0202708 A1 | 8/2007 | Luo et al. |
| 2007/0210371 A1 | 8/2007 | Hisamoto et al. |
| 2007/0215940 A1 | 9/2007 | Ligon |
| 2007/0231991 A1 | 10/2007 | Willer et al. |
| 2007/0232007 A1 | 10/2007 | Forbes |
| 2007/0246753 A1 | 10/2007 | Chu et al. |
| 2007/0262451 A1 | 11/2007 | Rachmady et al. |
| 2007/0267687 A1 | 11/2007 | Lue |
| 2007/0268753 A1 | 11/2007 | Lue et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0029399 A1 | 2/2008 | Tomita et al. |
| 2008/0048237 A1 | 2/2008 | Iwata |
| 2008/0054346 A1 | 3/2008 | Saitoh et al. |
| 2008/0057644 A1 | 3/2008 | Kwak et al. |
| 2008/0087942 A1 | 4/2008 | Hsu et al. |
| 2008/0087946 A1 | 4/2008 | Hsu et al. |
| 2008/0121932 A1* | 5/2008 | Ranade ............... 257/192 |
| 2008/0135946 A1* | 6/2008 | Yan ............... 257/390 |
| 2008/0146042 A1 | 6/2008 | Kostamo et al. |
| 2008/0150003 A1 | 6/2008 | Chen et al. |
| 2008/0175053 A1 | 7/2008 | Lue et al. |
| 2008/0230853 A1 | 9/2008 | Jang et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny et al. |
| 2008/0293254 A1 | 11/2008 | Ramkumar et al. |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0039416 A1 | 2/2009 | Lai et al. |
| 2009/0045452 A1 | 2/2009 | Lue et al. |
| 2009/0065849 A1 | 3/2009 | Noda |
| 2009/0152618 A1 | 6/2009 | Matsuo et al. |
| 2009/0152621 A1 | 6/2009 | Polishchuk et al. |
| 2009/0179253 A1 | 7/2009 | Levy et al. |
| 2009/0206385 A1 | 8/2009 | Kim et al. |
| 2009/0227116 A1 | 9/2009 | Joo et al. |
| 2009/0242969 A1 | 10/2009 | Tanaka |
| 2009/0294836 A1 | 12/2009 | Kiyotoshi |
| 2009/0294844 A1 | 12/2009 | Tanaka et al. |
| 2009/0302365 A1 | 12/2009 | Bhattacharyya |
| 2010/0006922 A1 | 1/2010 | Matsuoka et al. |
| 2010/0041222 A1 | 2/2010 | Puchner et al. |
| 2010/0096687 A1 | 4/2010 | Balseanu et al. |
| 2010/0117138 A1 | 5/2010 | Huerta et al. |
| 2010/0117139 A1 | 5/2010 | Lue |
| 2010/0155823 A1 | 6/2010 | Lue et al. |
| 2010/0178759 A1 | 7/2010 | Kim et al. |
| 2010/0252877 A1 | 10/2010 | Nakanishi et al. |
| 2010/0270609 A1 | 10/2010 | Olsen et al. |
| 2010/0283097 A1 | 11/2010 | Endoh et al. |
| 2010/0295118 A1 | 11/2010 | Bhattacharyya |
| 2011/0018053 A1 | 1/2011 | Lo et al. |
| 2011/0163371 A1 | 7/2011 | Song et al. |
| 2011/0233512 A1 | 9/2011 | Yang et al. |
| 2011/0237060 A1 | 9/2011 | Lee et al. |
| 2011/0248332 A1 | 10/2011 | Levy et al. |
| 2012/0007167 A1 | 1/2012 | Hung et al. |
| 2012/0068159 A1 | 3/2012 | Fujiki et al. |
| 2012/0068250 A1 | 3/2012 | Ino et al. |
| 2013/0175604 A1 | 7/2013 | Polishchuk et al. |
| 2013/0309826 A1 | 11/2013 | Ramkumar et al. |
| 2014/0264551 A1* | 9/2014 | Polishchuk et al. ........ 257/325 |
| 2016/0300724 A1 | 10/2016 | Levy et al. |

FOREIGN PATENT DOCUMENTS

| | | |
|---|---|---|
| CN | 1832201 A | 9/2006 |
| CN | 101517714 A | 8/2009 |
| CN | 101859702 A | 10/2010 |
| CN | 102142454 A | 8/2011 |
| CN | 101558481 B | 5/2012 |
| CN | 104254921 A | 12/2014 |
| JP | 2004172616 A | 6/2004 |
| JP | 2005347679 | 12/2005 |
| JP | 2005347679 A | 12/2005 |
| JP | 2007515060 A | 6/2007 |
| JP | 2007318112 | 12/2007 |
| JP | 2009535800 A | 10/2009 |
| JP | 2009260070 A | 11/2009 |
| JP | 2011507231 A | 3/2011 |
| JP | 2011527824 A | 11/2011 |
| KR | 20040070669 A | 8/2004 |
| KR | 20060100092 | 9/2006 |
| TW | 200703671 A | 1/2007 |
| TW | 200847343 A | 12/2008 |
| WO | 2007064048 A1 | 6/2007 |
| WO | 2008129478 A | 10/2008 |
| WO | 2011162725 A1 | 12/2011 |
| WO | 2013148112 A1 | 10/2013 |
| WO | 2013148343 A1 | 10/2013 |

OTHER PUBLICATIONS

Japanese Office Action for Japanese Application No. 2015-503338 dated Feb. 21, 2017; 21 pages.

Japanese Office Action for Japanese Application No. 2015-503338 dated Dec. 5, 2017; 5 pages.

Japanese Office Action for Japanese Application No. 2016-123646 dated Jun. 13, 2017; 7 pages.

SIPO Office Action for Application No. 200910134374.1 dated Jan. 21, 2015; 5 pages.

SIPO Office Action for Application No. 200910134374.1 dated Feb. 3, 2016; 2 pages.

SIPO Office Action for Application No. 200910134374.1 dated Jul. 29, 2014; 5 pages.

SIPO Office Action for Application No. 200910134374.1 dated Jul. 30, 2015; 2 pages.

SIPO Office Action for Application No. 200910134374.1 dated Sep. 22, 2013; 4 pages.

SIPO Office Action for Application No. 20120000107.5 dated Apr. 1, 2015; 5 pages.

SIPO Office Action for Application No. 20120000107.5 dated May 12, 2016; 5 pages.

SIPO Office Action for Application No. 20120000107.5 dated Jul. 25, 2014; 4 pages.

SIPO Office Action for Application No. 20120000107.5 dated Sep. 20, 2017; 6 pages.

SIPO Office Action for Application No. 20120000107.5 dated Oct. 9, 2015; 2 pages.

SIPO Office Action for Application No. 201280000107.5 dated Nov. 29, 2016; 5 pages.

SIPO Office Action for Application No. 2013800168932 dated Sep. 1, 2016; 7 pages.

SIPO Office Action for International Application No. 2013800168932 dated Apr. 21, 2017; 7 pages.

TIPO Office Action for Application No. 102110223 dated Nov. 18, 2016; 10 pages.

TIPO Office Action for Taiwan Application No. 101101220 dated Oct. 15, 2015; 4 pages.

(56) References Cited

OTHER PUBLICATIONS

TIPO Office Action for Taiwan Application No. 106107213 dated Jul. 4, 2017; 12 pages.
USPTO Advisory Action for U.S. Appl. No. 11/811,958 dated Mar. 16, 2010; 4 pages.
USPTO Advisory Action for U.S. Appl. No. 11/811,958 dated Apr. 20, 2010; 6 pages.
USPTO Advisory Action for U.S. Appl. No. 11/811,958 dated May 14, 2013; 4 pages.
USPTO Advisory Action for U.S. Appl. No. 11/811,958 dated Jun. 2, 2011; 5 pages.
USPTO Advisory Action for U.S. Appl. No. 13/436,872 dated Aug. 4, 2015; 2 pages.
USPTO Final Rejection for U.S. Appl. No. 11/811,958 dated Jan. 6, 2010; 17 pages.
USPTO Final Rejection for U.S. Appl. No. 11/811,958 dated Mar. 13, 2013; 22 pages.
USPTO Final Rejection for U.S. Appl. No. 11/811,958 dated Mar. 15, 2011; 13 pages.
USPTO Final Rejection for U.S. Appl. No. 13/007,533 dated Sep. 24, 2012; 13 pages.
USPTO Non Final Rejection for U.S. Appl. No. 11/811,958 dated Dec. 7, 2011; 13 pages.
USPTO Non Final Rejection for U.S. Appl. No. 13/007,533 dated Apr. 12, 2012; 9 pages.
USPTO Non-Final Rejection for U.S. Appl. No. 11/811,958 dated May 13, 2009; 14 pages.
USPTO Non-Final Rejection for U.S. Appl. No. 11/811,958 dated Oct. 1, 2012; 17 pages.
USPTO Non-Final Rejection for U.S. Appl. No. 11/811,958 dated Oct. 7, 2010; 12 pages.
USPTO Non-Final Rejection for U.S. Appl. No. 13/436,872 dated Dec. 19, 2014; 15 pages.
USPTO Non-Final Rejection for U.S. Appl. No. 13/917,500 dated Jan. 5, 2015; 13 pages.
USPTO Non-Final Rejection for U.S. Appl. No. 15/099,025 dated Oct. 6, 2017; 11 pages.
USPTO Notice of Allowance for U.S. Appl. No. 13/007,533 dated Mar. 7, 2013; 8 pages.
USPTO Notice of Allowance for U.S. Appl. No. 13/007,533 dated Jun. 18, 2013; 9 pages.
USPTO Notice of Allowance for U.S. Appl. No. 13/007,533 dated Sep. 6, 2013;9 pages.
USPTO Notice of Allowance for U.S. Appl. No. 13/007,533 dated Nov. 27, 2012; 13 pages.
USPTO Notice of Allowance for U.S. Appl. No. 13/007,533 dated Dec. 6, 2013; 10 pages.
USPTO Notice of Allowance for U.S. Appl. No. 13/436,872 dated Jan. 15, 2016; 5 pages.
USPTO Notice of Allowance for U.S. Appl. No. 13/436,872 dated Sep. 15, 2015; 9 pages.
USPTO Notice of Allowance for U.S. Appl. No. 13/917,500 dated Jun. 1, 2015; 6 pages.
USPTO Notice of Allowance for U.S. Appl. No. 13/917,500 dated Sep. 14, 2015; 5 pages.
USPTO Notice of Allowance for U.S. Appl. No. 13/917,500 dated Dec. 31, 2015; 5 pages.
USPTO Notice of Allowance for U.S. Appl. No. 14/172,775 dated Sep. 4, 2015; 7 pages.
USPTO Notice of Allowance for U.S. Appl. No. 14/172,775 dated Dec. 18, 2015; 6 pages.
USPTO Notice of Allowance for U.S. Appl. No. 13/436,872 dated May 11, 2016; 5 pages.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html>; 2 pages.
"ADNS-2051 High-Performance Optical Mouse Sensor," Agilent Technologies, downloaded Oct. 10, 2005, <http://www.home.agilent.com/USeng/nav/-536893734,536883737/pd.html>; 2 pages.

"Agilent ADNK-2030 Solid-State Optical Mouse Sensor," Agilent Technologies Inc., Sample Kit, 2003; 1 page.
"Agilent ADNS-2030 Low Power Optical Mouse Sensor," Agilent Technologies Inc., Data Sheet, 2005; 34 pages.
"Agilent ADNS-2051 Optical Mouse Sensor," Agilent Technologies Inc., Product Overview, 2003; 2 pages.
"Agilent Optical Mouse Sensors," Agilent Technologies Inc., Selection Guide, 2004; 3 pages.
"Algorithm for Managing Multiple First-In, First-Out Queues from a Single Shared Random-Access Memory," IBM Technical Disclosure Bulletin, Aug. 1989; 5 pages.
"Am99C10A 256.times.48 Content Addressable Memory", Advanced Micro Devices, Dec. 1992.
"An Analog PPL-Based Clock and Data Recovery Circuit with High Input Jitter Tolerance;" Sun, Reprinted from IEEE Journal of Solid-State Circuits, 1989; 4 pages.
"An EEPROM for Microprocessors and Custom Logic", by Roger Cuppens et al., IEEE Journal of Solid-State Circuits, vol. SC-20, No. 2, Apr. 1985, pp. 603-608.
"An EPROM Cell Structure foe EPLDs Compatible with Single Poly Gate Process", by Kuniyushi Yoshikawa et al., Extended Abstracts of the 18th (1986 International) Conference on Solid State Devices and Materials, Tokyo, 1986, pp. 323-326.
"An Experimental 5-V-Only 256-kbit CMOS EEPROM with a High-Performance Single-Polysilicon Cell", by Jun-Ichi Miyamoto et al., IEEE Journal of Solid State Circuits, vol. SC-21, No. 5, Oct. 1986, pp. 852-860.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
Hua-Ching Chien, Chin-Hsing Kao, Jui-Wen Chang and Tzung-Kuen Tsai_Two-bit SONOS type Flash using a band engineering in the nitride layer_dated Jun. 17, 2005_4 pages.
Hung et al., High-performance gate-all-around polycrystalline silicon nanowire with silicon nanocrystals nonvolatile memory, Appl. Phys. Lett, 98 162108 (2011), pub date: Apr. 22, 2011.
Krishnaswamy Ramkumar_Cypress SONOS Technology_Dated Jul. 6, 2011_9 pages.
Lue et al., "Be-SONOS: A Bandgap Engineered SONOS with Excellent Performance and Reliability," IEEE, 2005; 4 pages.
Lue, Hang-Ting et al., "Reliability Model of Bandgap Engineered SONOS (be-SONOS)", IEEE, 2006, 4 pgs.
Wang, Szu-Yu et al., "Reliability and processing effects of bandgap engineered SONOS flash memory", 2007 IEEE, International Reliability Symposium, Apr. 18, 2007, 5 pgs.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.
"MAX 9000 Programmable Logic Device Family," Altera, Jul. 1999, Version 6.01, pp. 1-40; 41 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
"1.8V, 500-MHz, 10-Output JEDEC-Compliant Zero Delay Buffer," Cypress Advance Information, Feb. 12, 2004; 9 pages.
"10 Gigabit Ethernet Technology Overview White Paper", Revision 1.0, Retrieved from Internet: URL: http://www.10gea.org, May, 2001.
"16K x 8/9 Dual-Port Static RAM with Sem, Int, Busy," Cypress Semiconductor Data Book, May 1995, CY7C006 and CY7C016, pp. 6:1-17; 10 pages.
"1K x 8 Dual-Port Static RAM," Cypress Semiconductor Data Book, May 1995, CY7C130/CY7C131 and CY7C140/CY7C141, pp. 6:37-49; 8 pages.
"1kHz to 30MHz Resistor Set SOT-23 Oscillator", Initial Release Final Electrical Specifications LTC1799, Linear Technology Corporation, Jan. 2001, pp. 1-4.
"200-MBaud HOTLink Transceiver," Cypress Semiconductor Corporation, Revised Feb. 13, 2004, CY7C924ADX, Document #38-02008 Rev. *D; 62 pages.

(56) References Cited

OTHER PUBLICATIONS

"2K x 16 Dual-Port Static RAM," Cypress Semiconductor Data Book, May 1995, CY7C133 and CY7C143, pp. 6:63-73; 7 pages.
"2K x 8 Dual-Port Static RAM," Cypress Semiconductor Data Book, May 1995, CY7C132/CY7C136 and CY7C142/CY7C146, pp. 6:50-62; 8 pages.
"3.3V 64K x 18 Synchronous QuadPort Static RAM," Cypress Preliminary CY7C0430BV, Cypress Semiconductor Corporation, Mar. 27, 2001; 36 pages.
"A Novel Integration Technology of EEPROM Embedded CMOS Logic VLSI Suitable for ASIC Applications", by Masataka Takebuchi et al., IEEE 1992 Custom Integrated Circuits Conference, pp. 9.6.1-9.6.4.
"A Novel Robust and Low Cost Stack Chips Package and Its Thermal Performance", by Soon-Jin Cho et al., IEEE Transaction on Advanced Packaging, vol. 23, No. 2, May 2000, pp. 257-265.
"A Planar Type EEPROM Cell Structure by Standard CMOS Process for Integration with Gate Array, Standard Cell, Microprocessor and for Neural Chips", by Katsuhiko Ohsaki et al., IEEE 1993 Custom Integrated Circuits Conference, pp-23.6.1-23.6.4.
"A Single Chip Sensor & Image Processor for Fingerprint Verification" Anderson, S., et al., IEEE Custom Integrated Circuits Conference, May 12-15, 1991.
"A Single Poly EPROM for Custom CMOS Logic Applications", by Reza Kazerounian et al., IEEE 1986 Custom Integrated Circuits Conference, pp. 59-62.
"A Wide-Bandwidth Low-Voltage PLL for PowerPC.TM. Microprocessors", by Jose Alvarez et al., IEEE Journal of Solid-State Circuits, vol. 30, No. 4, Apr. 1995, pp. 383-391.
"About SMaL Camera Technologies, Inc.", SMaL Camera Technologies, 2001, 1 page.
"Achieving Uniform nMOS Device Power Distribution for Submicron ESD Reliability;" Charvaka Duvvuy, Carlos Diaz, and Tim Haddock; 1992; 92-131 through 92-134, no month.
Chinese Office Action for Application No. 200880000820.3 dated Jan. 26, 2011; 6 pages.
International Search Report for International Application No. PCT/US08/06627 dated Aug. 26, 2008; 2 pages.
International Search Report for International Application No. PCT/US13/48876 dated Jul. 26, 2013; 5 pages.
Milton Ohring, "The Materials Science of Thin Films: Deposition and Structure," 2nd Edition, Academic Press, 2002, pp. 336-337; 4 pages.
SIPO Office Action for Chinese Application No. 2013800319699 dated May 31, 2017; 17 pages.
SIPO Office Action for CN Application No. 201380031969.9 dated Aug. 19, 2016; 8 pages.
USPTO Advisory Action for U.S. Appl. No. 12/197,466 dated Jan. 31, 2012; 3 pages.
USPTO Final Rejection for U.S. Appl. No. 12/124,855 dated Jan. 31, 2012; 7 pages.
USPTO Final Rejection for U.S. Appl. No. 12/124,855 dated May 10, 2010; 11 pages.
USPTO Final Rejection for U.S. Appl. No. 12/197,466 dated Nov. 17, 2011; 13 pages.
USPTO Non Final Rejection for U.S. Appl. No. 13/539,458 dated Mar. 13, 2013; 5 pages.
USPTO Non Final Rejection for U.S. Appl. No. 13/539,458 dated Oct. 2, 2014; 5 pages.
USPTO Non Final Rejection for U.S. Appl. No. 13/620,071 dated Apr. 3, 2014; 12 pages.
USPTO Non-Final Rejection for U.S. Appl. No. 12/124,855 dated Jan. 18, 2011; 5 pages.
USPTO Non-Final Rejection for U.S. Appl. No. 12/124,855 dated Aug. 16, 2011; 9 pages.
USPTO Non-Final Rejection for U.S. Appl. No. 12/124,855 dated Oct. 29, 2009; 9 pages.
USPTO Non-Final Rejection for U.S. Appl. No. 12/197,466 dated Jun. 1, 2011; 11 pages.
USPTO Notice of Allowance for U.S. Appl. No. 12/124,855 dated May 1, 2012; 7 pages.
USPTO Notice of Allowance for U.S. Appl. No. 12/124,855 dated May 3, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Notice of Allowance for U.S. Appl. No. 13/539,458 dated May 24, 2013; 8 pages.
USPTO Notice of Allowance for U.S. Appl. No. 13/539,458 dated Aug. 4, 2014; 7 pages.
USPTO Notice of Allowance for U.S. Appl. No. 13/539,458 dated Nov. 3, 2014; 7 pages.
USPTO Notice of Allowance for U.S. Appl. No. 13/620,071 dated Jan. 23, 2015; 5 pages.
USPTO Notice of Allowance for U.S. Appl. No. 13/620,071 dated Oct. 27, 2014; 7 pages.
USPTO Requirement Restriction for U.S. Appl. No. 12/197,466 dated Mar. 11, 2011; 5 pages.
Written Opinion of the International Searching Authority for International Application No. PCT/US08/06627 dated Aug. 26, 2008; 5 pages.
Written Opinion of the International Searching Authority for International Application No. PCT/US13/48876 dated Jul. 26, 2013; 3 pages.
European Search Report for European Application No. 13767422.2 dated Mar. 30, 2017; 6 pages.
European Search Report for European Application No. 13767422.2 dated Oct. 20, 2015; 5 pages.
International Search Report for International Application No. PCT/US12/021583 dated May 8, 2012; 2 pages.
International Search Report for International Application No. PCT/US13/32339 dated May 30, 2013; 2 pages.
International Search Report for International Application No. PCT/US13/48885 dated Nov. 14, 2013; 2 pages.
SIPO Office Action for Application No. 201380031840.8 dated Jan. 6, 2017; 8 pages.
SIPO Office Action for Application No. 201380031840.8 dated Sep. 25, 2017; 6 pages.
USPTO Final Rejection for U.S. Appl. No. 13/436,872 dated May 27, 2015; 14 pages.
USPTO Final Rejection for U.S. Appl. No. 14/307,858 dated Oct. 8, 2015; 6 pages.
USPTO Final Rejection for U.S. Appl. No. 15/376,282 dated Dec. 19, 2017; 19 pages.
USPTO Non Final Rejection for U.S. Appl. No. 13/620,071 dated Jul. 18, 2014; 5 pages.
USPTO Non-Final Rejection for U.S. Appl. No. 12/152,518 dated Mar. 9, 2011; 4 pages.
USPTO Non-Final Rejection for U.S. Appl. No. 12/152,518 dated Sep. 29, 2010; 5 pages.
USPTO Non-Final Rejection for U.S. Appl. No. 13/288,919 dated Jun. 19, 2014; 5 pages.
USPTO Non-Final Rejection for U.S. Appl. No. 13/288,919 dated Dec. 5, 2013; 4 pages.
USPTO Non-Final Rejection for U.S. Appl. No. 13/539,466 dated Sep. 28, 2012; 9 pages.
USPTO Non-Final Rejection for U.S. Appl. No. 14/159,315 dated Oct. 21, 2014; 12 pages.
USPTO Non-Final Rejection for U.S. Appl. No. 14/172,775 dated Jun. 22, 2015; 14 pages.
USPTO Non-Final Rejection for U.S. Appl. No. 14/307,858 dated Jun. 29, 2015; 5 pages.
USPTO Non-Final Rejection for U.S. Appl. No. 15/189,668 dated Sep. 22, 2017; 11 pages.
USPTO Non-Final Rejection for U.S. Appl. No. 15/335,180 dated May 17, 2017; 81 pages.

(56) References Cited

OTHER PUBLICATIONS

USPTO Non-Final Rejection for U.S. Appl. No. 15/376,282 dated Jul. 11, 2017; 16 pages.
USPTO Notice of Allowance for U.S. Appl. No. 12/152,518 dated Jul. 14, 2011; 6 pages.
USPTO Notice of Allowance for U.S. Appl. No. 13/288,919 dated Apr. 28, 2014; 5 pages.
USPTO Notice of Allowance for U.S. Appl. No. 13/288,919 dated Jul. 8, 2014; 5 pages.
USPTO Notice of Allowance for U.S. Appl. No. 13/288,919 dated Aug. 26, 2014; 7 pages.
USPTO Notice of Allowance for U.S. Appl. No. 13/539,466 dated Sep. 4, 2013; 9 pages.
USPTO Notice of Allowance for U.S. Appl. No. 13/539,466 dated Nov. 13, 2013; 9 pages.
USPTO Notice of Allowance for U.S. Appl. No. 13/539,466 dated Nov. 27, 2012; 8 pages.
USPTO Notice of Allowance for U.S. Appl. No. 14/159,315 dated Feb. 18, 2015; 9 pages.
USPTO Notice of Allowance for U.S. Appl. No. 14/159,315 dated Mar. 23, 2015; 9 pages.
USPTO Notice of Allowance for U.S. Appl. No. 14/307,858 dated Nov. 27, 2015; 5 pages.
USPTO Notice of Allowance for U.S. Appl. No. 14/811,346 dated Jul. 19, 2016; 7 pages.
USPTO Notice of Allowance for U.S. Appl. No. 15/335,180 dated Oct. 4, 2017; 9 pages.
USPTO Requirement for Restriction for U.S. Appl. No. 12/152,518 dated Jun. 9, 2010; 5 pages.
USPTO Requirement for Restriction for U.S. Appl. No. 13/007,533 dated Dec. 6, 2011; 7 pages.
USPTO Requirement for Restriction for U.S. Appl. No. 14/307,858 dated May 18, 2015; 7 pages.
Written Opinion of the International Searching Authority for International Application No. PCT/US13/32339 dated May 30, 2013; 7 pages.
Written Opinion of the International Searching Authority for International Application No. PCT/US2012/21583 dated May 8, 2012; 4 pages.
Written Opinion of the International Searching Authority for International Application No. PCT/US2013/048885 dated Nov. 14, 2013; 7 pages.
SIPO Office Action for Chinese Application No. 2013800168932 dated Jan. 26, 2018; 11 pages.
SIPO Office Action for Chinese Application No. 2013800319699 dated Jan. 29, 2018; 7 pages.
USPTO Final Rejection for U.S. Appl. No. 15/099,025 dated Apr. 30, 2018; 12 pages.
USPTO Non-Final Rejection for U.S. Appl. No. 15/864,832 dated May 15, 2018; 17 pages.
KIPO Office Action for International Application No. 10-2012-7008106 dated Mar. 20, 2018; 7 pages.
USPTO Non-Final Rejection for U.S. Appl. No. 15/376,282 dated Jun. 11, 2018; 17 pages.
TIPO Office Action for Taiwan Patent Application No. 106121057 dated Jun. 1, 2018; 3 pages.
European Summons Oral Proceedings for European Application No. 13767422.2 dated May 23, 2018; 10 pages.
SIPO Office Action for Chinese Application No. 2013800168932 dated Jul. 4, 2018; 7 pages.
SIPO Office Action for Chinese Application No. 2013800319699 dated Aug. 20, 2018; 7 pages.
USPTO Final Rejection for U.S. Appl. No. 15/376,282 dated Dec. 5, 2018, 17 pages.
USPTO Final Rejection for U.S. Appl. No. 15/864,832 dated Nov. 1, 2018, 23 pages.
USPTO Non-Final Rejection for U.S. Appl. No. 15/099,025 dated Dec. 31, 2018, 9 pages.
KIPO Office Action for International Application No. 10-2012-7008108 dated Oct. 5, 2018, 3 pages.
Japanese Office Action for Japanese Application No. 2015-503338 dated Jan. 15, 2019, 11 pages.
KIPO Office Action for International Application No. 10-2012-7008106 dated Jan. 29, 2019; 3 pages.
USPTO Notice of Allowance for U.S. Appl. No. 15/864,832 dated Jan. 18, 2019, 8 pages.

* cited by examiner

RADICAL OXIDATION PROCESS FOR FABRICATING A NONVOLATILE CHARGE TRAP MEMORY DEVICE

CROSS-REFERENCE TO RELATED APPLICATIONS

This application is a continuation of U.S. patent application Ser. No. 13/539,458, filed Jul. 1, 2012, which is a continuation-in-part of U.S. patent application Ser. No. 12/197,466, filed Aug. 25, 2008, now U.S. Pat. No. 8,318, 608, issued Nov. 27, 2012, which is a continuation of U.S. patent application Ser. No. 12/124,855, filed May 21, 2008, now U.S. Pat. No. 8,283,261, issued Oct. 9, 2012, which claims the benefit of priority under 35 U.S.C. 119(e) to U.S. Provisional Patent Application Ser. No. 60/940,139, filed May 25, 2007, and U.S. Provisional Application No. 60/986, 637, filed Nov. 9, 2007, all of which are incorporated by reference herein in their entirety.

TECHNICAL FIELD

Embodiments of the present invention are in the field of Semiconductor Fabrication and, in particular, Semiconductor Device Fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile semiconductor memories typically use stacked floating gate type field-effect-transistors. In such transistors, electrons are injected into a floating gate of a memory cell to be programmed by biasing a control gate and grounding a body region of a substrate on which the memory cell is formed. An oxide-nitride-oxide (ONO) stack is used as either a charge storing layer, as in a semiconductor-oxide-nitride-oxide-semiconductor (SONOS) transistor, or as an isolation layer between the floating gate and control gate, as in a split gate flash transistor. FIG. 1 illustrates a cross-sectional view of a conventional nonvolatile charge trap memory device.

Referring to FIG. 1, semiconductor device 100 includes a SONOS gate stack 104 including a conventional ONO portion 106 formed over a silicon substrate 102. Semiconductor device 100 further includes source and drain regions 110 on either side of SONOS gate stack 104 to define a channel region 112. SONOS gate stack 104 includes a poly-silicon gate layer 108 formed above and in contact with ONO portion 106. Polysilicon gate layer 108 is electrically isolated from silicon substrate 102 by ONO portion 106. ONO portion 106 typically includes a tunnel oxide layer 106A, a nitride or oxynitride charge-trapping layer 106B, and a top oxide layer 106C overlying nitride or oxynitride layer 106B.

One problem with conventional SONOS transistors is the poor data retention in the nitride or oxy-nitride layer 106B that limits semiconductor device 100 lifetime and its use in several applications due to leakage current through the layer.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
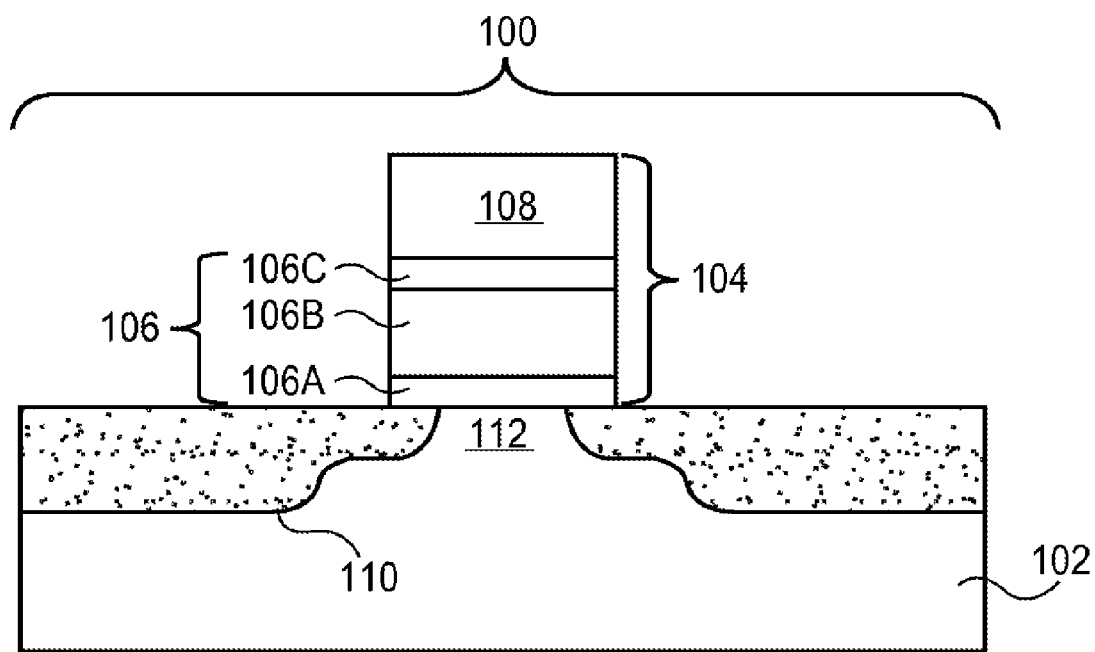
FIG. 1 illustrates a cross-sectional view of a conventional nonvolatile charge trap memory device.

Embodiments of a non-volatile charge trap memory device integrated with logic devices are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Methods to fabricate a nonvolatile charge trap memory device are described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein is a method to fabricate a nonvolatile charge trap memory device. A substrate may first be provided having a charge-trapping layer disposed thereon. In one embodiment, a portion of the charge-trapping layer is then oxidized to form a blocking dielectric layer above the charge-trapping layer by exposing the charge-trapping layer to a radical oxidation process.

Formation of a dielectric layer by a radical oxidation process may provide higher quality films than processes involving steam growth, i.e. wet growth processes. Furthermore, a radical oxidation process carried out in a batch-processing chamber may provide high quality films without impacting the throughput (wafers/Hr) requirements that a fabrication facility may require. By carrying out the radical oxidation process at temperatures compatible with such a chamber, such as temperatures approximately in the range of 600-900 degrees Celsius, the thermal budget tolerated by the substrate and any other features on the substrate may not be impacted to the extent typical of processes over 1000 degrees Celsius. In accordance with an embodiment of the present invention, a radical oxidation process involving flowing hydrogen ($H_2$) and oxygen ($O_2$) gas into a batch-processing chamber is carried out to effect growth of a dielectric layer by oxidation consumption of an exposed substrate or film. In one embodiment, multiple radical oxidation processes are carried out to provide a tunnel dielectric layer and a blocking dielectric layer for a nonvolatile charge trap memory device. These dielectric layers may be of very high quality, even at a reduced thickness. In one embodiment, the tunnel dielectric layer and the blocking dielectric layer are both denser and are composed of substantially fewer hydrogen atoms/cm3 than a tunnel dielectric layer or a blocking dielectric layer formed by wet oxidation techniques. In accordance with another embodiment of the present invention, a dielectric layer formed by carrying out a radical oxidation process is less susceptible to crystal plane orientation differences in the substrate from which it is grown. In one embodiment, the cornering effect caused by differential crystal plane oxidation rates is significantly reduced by forming a dielectric layer via a radical oxidation process.

Figure 2:
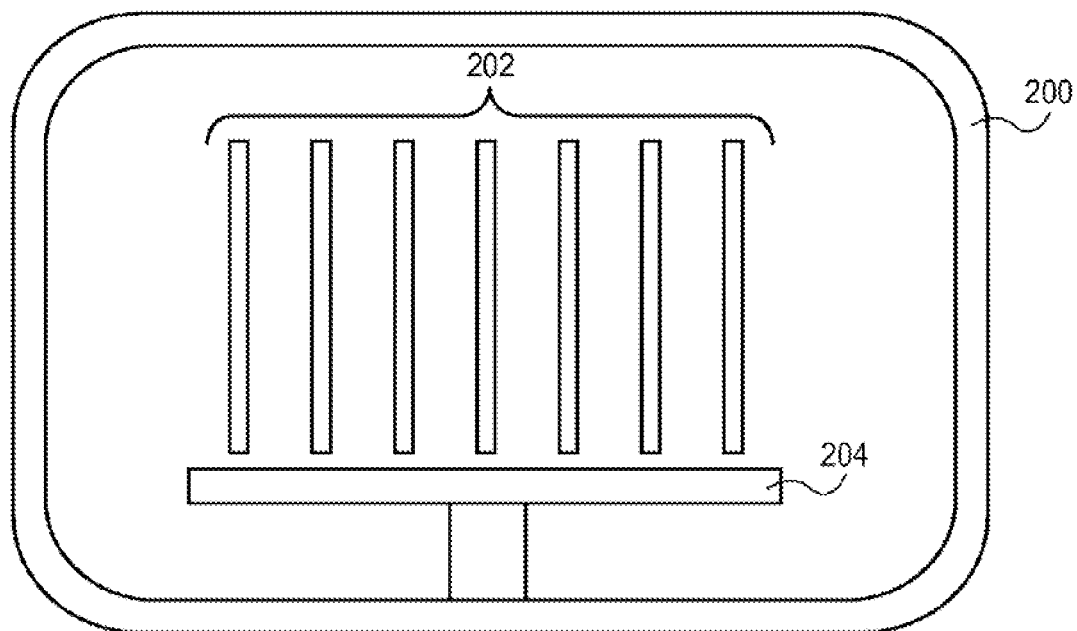
FIG. 2 illustrates a cross-sectional view of an oxidation chamber of a batch-processing tool, in accordance with an embodiment of the present invention.

A portion of a nonvolatile charge trap memory device may be fabricated by carrying out a radical oxidation process in a process chamber. In accordance with an embodiment of the present invention, the process chamber is a batch-processing chamber. FIG. 2 illustrates a cross-sectional view of an oxidation chamber of a batch-processing tool, in accordance with that embodiment. Referring to FIG. 2, a batch-processing chamber 200 includes a carrier apparatus 204 to hold a plurality of semiconductor wafers 202. In one embodiment, the batch-processing chamber is an oxidation chamber. In a specific embodiment, the process chamber is a low-pressure chemical vapor deposition chamber. The plurality of semiconductor wafers 202 may be arranged in such a way as to maximize exposure of each wafer to a radical oxidation process, while enabling the inclusion of a reasonable number of wafers (e.g. 25 wafers), to be processed in a single pass. It should be understood, however, that the present invention is not limited to a batch-processing chamber.

Figure 3:
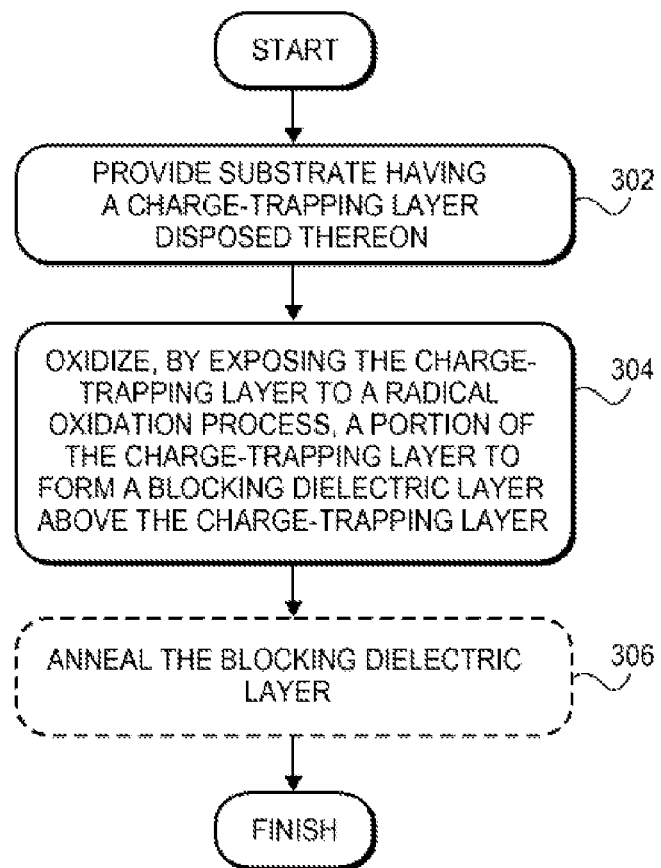
FIG. 3 depicts a Flowchart representing a series of operations in a method for fabricating a nonvolatile charge trap memory device, in accordance with an embodiment of the present invention.
Figure 4A:
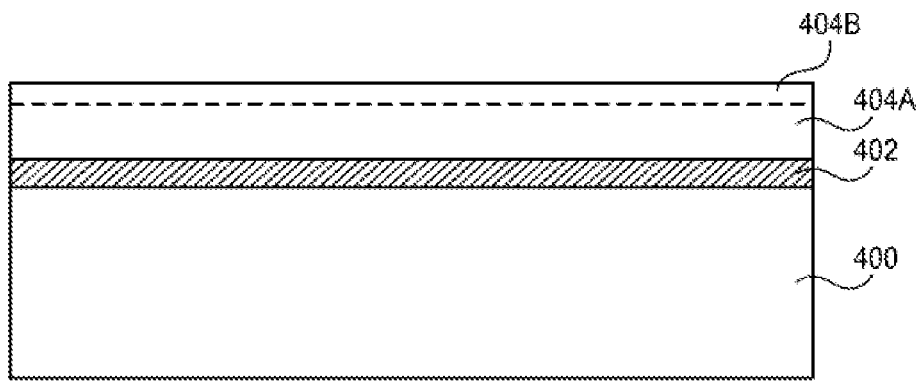
FIG. 4A illustrates a cross-sectional view of a substrate having a charge trapping layer formed thereon, corresponding to operation 302 from the Flowchart of FIG. 3, in accordance with an embodiment of the present invention.
Figure 4B:
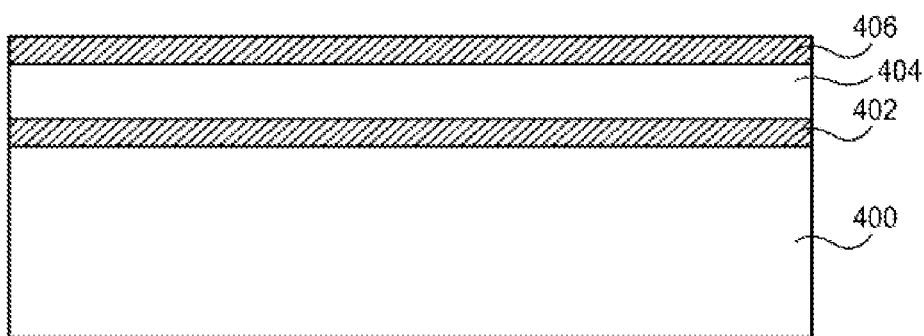
FIG. 4B illustrates a cross-sectional view of a substrate having a charge trapping layer with a blocking dielectric layer formed thereon, corresponding to operation 304 from the Flowchart of FIG. 3, in accordance with an embodiment of the present invention.

In an aspect of the present invention, a portion of a nonvolatile charge trap memory device is fabricated by a radical oxidation process. FIG. 3 depicts a Flowchart representing a series of operations in a method for fabricating a nonvolatile charge trap memory device, in accordance with an embodiment of the present invention. FIGS. 4A-4B illustrate cross-sectional views representing operations in the fabrication of a nonvolatile charge trap memory device, in accordance with an embodiment of the present invention.

FIG. 4A illustrates a cross-sectional view of a substrate having a charge trapping layer formed thereon, corresponding to operation 302 from the Flowchart of FIG. 3, in accordance with an embodiment of the present invention. Referring to operation 302 of Flowchart 300 and corresponding FIG. 4A, a substrate 400 is provided having a charge-trapping layer disposed thereon. In an embodiment, the charge-trapping layer has a first region 404A and a second region 404B disposed above substrate 400. In one embodiment, a dielectric layer 402 is disposed between substrate 400 and the charge trapping layer, as depicted in FIG. 4A. The charge-trapping layer may be composed of a material and have a thickness suitable to store charge and, hence, change the threshold voltage of a subsequently formed gate stack. In an embodiment, region 404A of the charge-trapping layer will remain as an intact charge-trapping layer following subsequent process operations. However, in that embodiment, region 404B of the as-formed charge trapping layer will be consumed to form a second dielectric layer, above region 404A.

FIG. 4B illustrates a cross-sectional view of a substrate having a charge trapping layer with a blocking dielectric layer formed thereon, corresponding to operation 304 from the Flowchart of FIG. 3, in accordance with an embodiment of the present invention. Referring to operation 304 of Flowchart 300 and corresponding FIG. 4B, a blocking dielectric layer 406 is formed on charge-trapping layer 404. In accordance with an embodiment of the present invention, blocking dielectric layer 406 is formed by oxidizing region 404B of the charge-trapping layer by exposing the charge-trapping layer to a radical oxidation process. In that embodiment, region 404A of the original charge trapping layer is now labeled as charge-trapping layer 404.

Blocking dielectric layer 406 may be composed of a material and have a thickness suitable to maintain a barrier to charge leakage without significantly decreasing the capacitance of a subsequently formed gate stack in a nonvolatile charge trap memory device. In a specific embodiment, region 404B is a silicon-rich silicon oxy-nitride region having a thickness approximately in the range of 2-3 nanometers and is oxidized to form blocking dielectric layer 406 having a thickness approximately in the range of 3.5-4.5 nanometers. In that embodiment, blocking dielectric layer 406 is composed of silicon dioxide.

Blocking dielectric layer 406 may be formed by a radical oxidation process. In accordance with an embodiment of the present invention, the radical oxidation process involves flowing hydrogen (Hz) and oxygen (Oz) gas into a furnace, such as the batch processing chamber 200 described in association with FIG. 2. In one embodiment, the partial pressures of Hz and Oz have a ratio to one another of approximately 1:1. However, in an embodiment, an ignition event is not carried out which would otherwise typically be used to pyrolyze the $H_2$ and $O_2$ to form steam. Instead, $H_2$ and $O_2$ are permitted to react to form radicals at the surface of region 404B. In one embodiment, the radicals are used to consume region 404B to provide blocking dielectric layer 406. In a specific embodiment, the radical oxidation process includes oxidizing with a radical such as, but not limited to, an OH radical, an $HO_2$ radical or an O diradical at a temperature approximately in the range of 600-900 degrees Celsius. In a particular embodiment, the radical oxidation process is carried out at a temperature approximately in the range of 700-800 degrees Celsius at a pressure approximately in the range of 0.5-5 Torr. In one embodiment, the second radical oxidation process is carried out for a duration approximately in the range of 100-150 minutes.

Referring to operation 306 of Flowchart 300, blocking dielectric layer 406 may be further subjected to a nitridation process in the first process chamber. In accordance with an embodiment of the present invention, the nitridation process includes annealing blocking dielectric layer 406 in an atmosphere including nitrogen at a temperature approximately in the range of 700-800 degrees Celsius for a duration approximately in the range of 5 minutes-60 minutes. In one embodiment, the atmosphere including nitrogen is composed of a gas such as, but not limited to, nitrogen (N2), nitrous oxide (N2O), nitrogen dioxide (NO2), nitric oxide (NO) or ammonia (NH3). Alternatively, this nitridation step, i.e. operation 306 from Flowchart 300, may be skipped.

Figure 5:
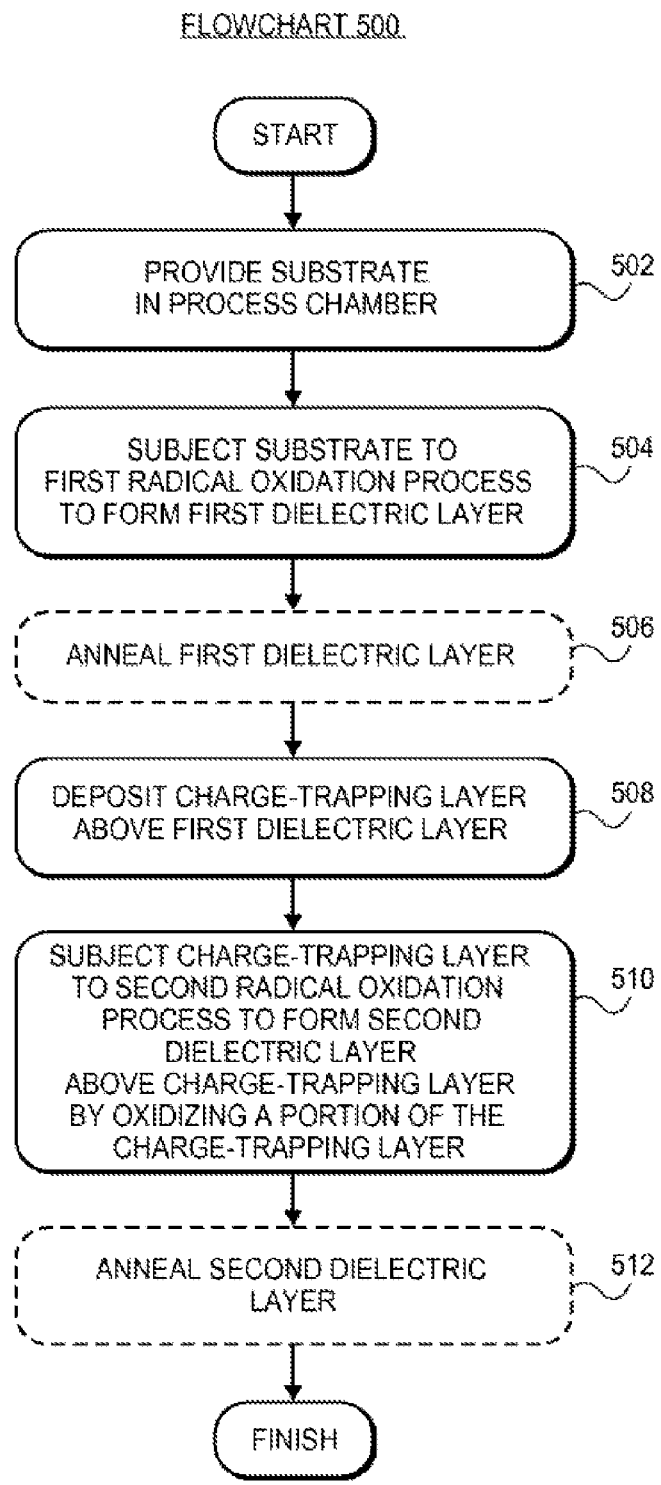
FIG. 5 depicts a Flowchart representing a series of operations in a method for fabricating a nonvolatile charge trap memory device, in accordance with an embodiment of the present invention.

In an aspect of the present invention, both a tunnel dielectric layer and a blocking dielectric layer may be formed by radical oxidation processes. FIG. 5 depicts a Flowchart 500 representing a series of operations in a method for fabricating a nonvolatile charge trap memory device, in accordance with an embodiment of the present invention. FIGS. 6A-6E illustrates cross-sectional views representing operations in the fabrication of a nonvolatile charge trap memory device, in accordance with an embodiment of the present invention.

Figure 6A:
FIG. 6A illustrates a cross-sectional view of a substrate, corresponding to operation 502 from the Flowchart of FIG. 5, in accordance with an embodiment of the present invention.

FIG. 6A illustrates a cross-sectional view of a substrate, corresponding to operation 502 from the Flowchart of FIG. 5, in accordance with an embodiment of the present invention. Referring to operation 502 of Flowchart 500 and corresponding FIG. 6A, a substrate 600 is provided in a process chamber.

Substrate 600 may be composed of a material suitable for semiconductor device fabrication. In one embodiment, substrate 600 is a bulk substrate composed of a single crystal of a material which may include, but is not limited to, silicon, germanium, silicon-germanium or a III-V compound semiconductor material. In another embodiment, substrate 600 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 600 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 600 may further include dopant impurity atoms.

Figure 6B:
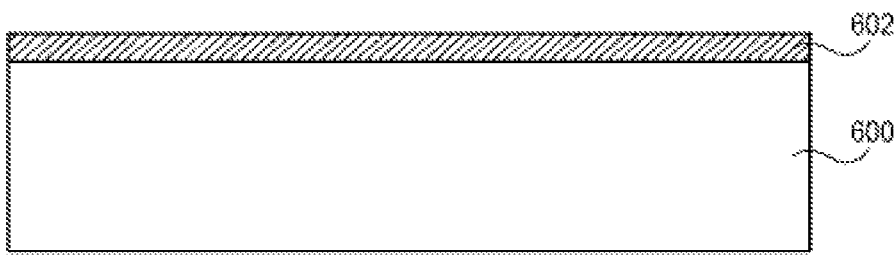
FIG. 6B illustrates a cross-sectional view of a substrate having a first dielectric layer formed thereon, corresponding to operation 504 from the Flowchart of FIG. 5, in accordance with an embodiment of the present invention.

FIG. 6B illustrates a cross-sectional view of a substrate having a dielectric layer formed thereon, corresponding to operation 504 from the Flowchart of FIG. 5, in accordance with an embodiment of the present invention. Referring to operation 504 of Flowchart 500 and corresponding FIG. 6B, substrate 600 is subjected to a first radical oxidation process to form a first dielectric layer 602.

First dielectric layer 602 may be composed of a material and have a thickness suitable to allow charge carriers to tunnel into a subsequently formed charge trapping layer under an applied gate bias, while maintaining a suitable barrier to leakage when a subsequently formed nonvolatile charge trap memory device is unbiased. First dielectric layer 602 may be referred to in the art as a tunnel dielectric layer. In accordance with an embodiment of the present invention, first dielectric layer 602 is formed by an oxidation process where the top surface of substrate 600 is consumed. Thus, in an embodiment, first dielectric layer 602 is composed of an oxide of the material of substrate 600. For example, in one embodiment, substrate 600 is composed of silicon and first dielectric layer 602 is composed of silicon dioxide. In a specific embodiment, first dielectric layer 602 is formed to a thickness approximately in the range of 1-10 nanometers. In a particular embodiment, first dielectric layer 602 is formed to a thickness approximately in the range of 1.5-2.5 nanometers.

First dielectric layer 602 may be formed by a radical oxidation process. In accordance with an embodiment of the present invention, the radical oxidation process involves flowing hydrogen (H2) and oxygen (O2) gas into a furnace, such as the batch processing chamber 200 described in association with FIG. 2. In one embodiment, the partial pressures of Hz and Oz have a ratio to one another of approximately 1:1. However, in an embodiment, an ignition event is not carried out which would otherwise typically be used to pyrolyze the Hz and Oz to form steam. Instead, Hz and Oz are permitted to react to form radicals at the surface of substrate 600. In one embodiment, the radicals are used to consume the top portion of substrate 600 to provide first dielectric layer 602. In a specific embodiment, the radical oxidation process includes oxidizing with a radical such as, but not limited to, an OH radical, an $HO_2$ radical or an O diradical at a temperature approximately in the range of 600-900 degrees Celsius. In a particular embodiment, the radical oxidation process is carried out at a temperature approximately in the range of 700-800 degrees Celsius at a pressure approximately in the range of 0.5-5 Torr. In one embodiment, the radical oxidation process is carried out for a duration approximately in the range of 100-150 minutes. In accordance with an embodiment of the present invention, first dielectric layer 602 is formed as a high-density, low-hydrogen-content film.

Referring to operation 506 of Flowchart 500, subsequent to forming first dielectric layer 602, but prior to any further processing, first dielectric layer 602 may be subjected to a nitridation process. In an embodiment, the nitridation process is carried out in the same process chamber used to form first dielectric layer 502, without removing substrate 600 from the process chamber between process steps. In one embodiment, the annealing includes heating substrate 600 in an atmosphere including nitrogen at a temperature approximately in the range of 700-800 degrees Celsius for a duration approximately in the range of 5 minutes-60 minutes. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$). In one embodiment, the nitridation occurs following a nitrogen or argon purge of the process chamber following the first radical oxidation process. Alternatively, the above nitridation step may be skipped.

Figure 6C:
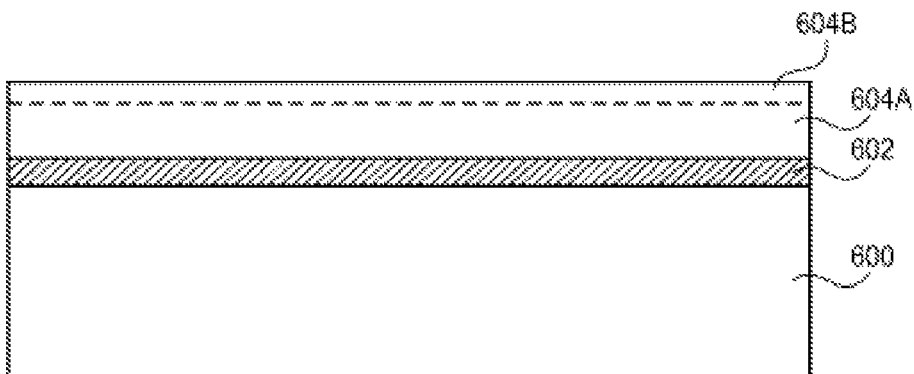
FIG. 6C illustrates a cross-sectional view of a substrate having a charge trapping layer formed thereon, corresponding to operation 508 from the Flowchart of FIG. 5, in accordance with an embodiment of the present invention.

FIG. 6C illustrates a cross-sectional view of a substrate having a charge trapping layer formed thereon, corresponding to operation 508 from the Flowchart of FIG. 5, in accordance with an embodiment of the present invention. Referring to operation 508 of Flowchart 500 and corresponding FIG. 6C, a charge-trapping layer having a first region 604A and a second region 604B is formed on first dielectric layer 602. In an embodiment, the formation of the charge-trapping layer is carried out in the same process chamber used to form first dielectric layer 602, without removing substrate 600 from the process chamber between process steps.

The charge-trapping layer may be composed of a material and have a thickness suitable to store charge and, hence, change the threshold voltage of a subsequently formed gate stack. In accordance with an embodiment of the present invention, the charge-trapping layer is composed of two regions 604A and 604B, as depicted in FIG. 6C. In an embodiment, region 604A of the charge-trapping layer will remain as an intact charge-trapping layer following subsequent process operations. However, in that embodiment, region 604B of the as-formed charge-trapping layer will be consumed to form a second dielectric layer, above region 604A.

The charge-trapping layer having regions 604A and 604B may be formed by a chemical vapor deposition process. In accordance with an embodiment of the present invention, the charge-trapping layer is composed of a material such as, but not limited to, silicon nitride, silicon oxy-nitride, oxygen-rich silicon oxy-nitride or silicon-rich silicon oxy-nitride. In one embodiment, regions 604A and 604B of the charge-trapping layer are formed at a temperature approximately in the range of 600-900 degrees Celsius. In a specific embodiment, the charge-trapping layer is formed by using gases such as, but not limited to, dichlorosilane ($H_2SiCl_2$), bis-(tert-butylamino)silane (BTBAS), ammonia ($NH_3$) or nitrous oxide ($N_2O$). In one embodiment, the charge trapping layer is formed to a total thickness approximately in the range of 5-15 nanometers and region 604B accounts for a thickness approximately in the range of 2-3 nanometers of the total thickness of the charge-trapping layer. In that embodiment, region 604A accounts for the remaining total thickness of the charge-trapping layer, i.e. region 604A accounts for the portion of the charge-trapping layer that is not subsequently consumed to form a top or blocking dielectric layer.

In another aspect of the present invention, the charge-trapping layer may include multiple composition regions. For example, in accordance with an embodiment of the present invention, the charge-trapping layer includes an oxygen-rich portion and a silicon-rich portion and is formed by depositing an oxygen-rich oxy-nitride film by a first composition of gases and, subsequently, depositing a silicon-rich oxy-nitride film by a second composition of gases. In one embodiment, the charge-trapping layer is formed by modifying the flow rate of ammonia (NH3) gas, and introducing nitrous oxide (N2O) and dichlorosilane (SiH2Cb) to provide the desired gas ratios to yield first an oxygen-rich oxy-nitride film and then a silicon-rich oxy-nitride film. In a specific embodiment, the oxygen-rich oxy-nitride film is formed by introducing a process gas mixture including N2O, NH3 and SiH2Cb, while maintaining the process chamber at a pressure approximately in the range of 5-500 mTorr, and maintaining substrate 600 at a temperature approximately in the range of 700-850 degrees Celsius, for a period approximately in the range of 2.5-20 minutes. In a further embodiment, the process gas mixture includes $N_2O$ and $NH_3$ having a ratio of from about 8:1 to about 1:8 and $SiH_2Cl_2$ and $NH_3$ having a ratio of from about 1:7 to about 7:1, and can be introduced at a flow rate approximately in the range of 5-200 standard cubic centimeters per minute (sccm). In another specific embodiment, the silicon-rich oxy-nitride film is formed by introducing a process gas mixture including N2O, NH3 and SiH2Cb, while maintaining the chamber at a pressure approximately in the range of 5-500 mTorr, and maintaining substrate 600 at a temperature approximately in the range of 700-850 degrees Celsius, for a period approximately in the range of 2.5-20 minutes. In a further embodiment, the process gas mixture includes N2O and NH3 having a ratio of from about 8:1 to about 1:8 and SiH2Cb and NH3 mixed in a ratio of from about 1:7 to about 7:1, introduced at a flow rate of from about 5 to about 20 seem. In accordance with an embodiment of the present invention, the charge-trapping layer comprises a bottom oxygen-rich silicon oxy-nitride portion having a thickness approximately in the range of 2.5-3.5 nanometers and a top silicon-rich silicon oxy-nitride portion having a thickness approximately in the range of 9-10 nanometers. In one embodiment, a region 504B of charge-trapping layer accounts for a thickness approximately in the range of 2-3 nanometers of the total thickness of the top silicon-rich silicon oxy-nitride portion of the charge-trapping layer. Thus, region 604B, which is targeted for subsequent consumption to form a second dielectric layer, may be composed entirely of silicon-rich silicon oxy-nitride.

Figure 6D:
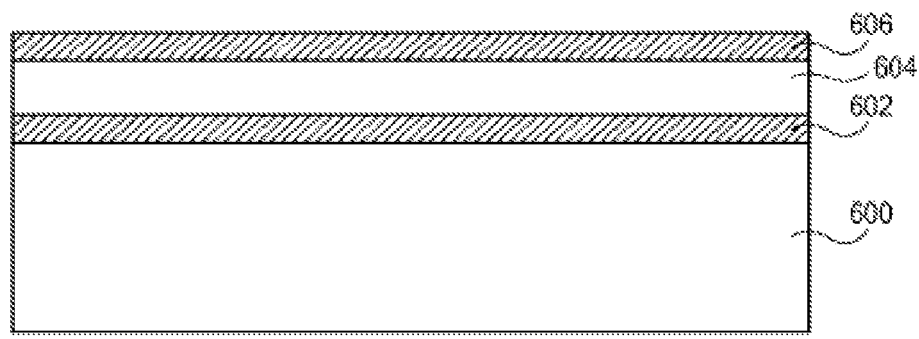
FIG. 6D illustrates a cross-sectional view of a substrate having a charge trapping layer with a blocking dielectric layer formed thereon, corresponding to operation 510 from the Flowchart of FIG. 5, in accordance with an embodiment of the present invention.

FIG. 6D illustrates a cross-sectional view of a substrate having a second dielectric layer formed thereon, corresponding to operation 510 from the Flowchart of FIG. 5, in accordance with an embodiment of the present invention. Referring to operation 510 of Flowchart 500 and corresponding FIG. 6D, a second dielectric layer 606 is formed on charge-trapping layer 604. In an embodiment, the formation of second dielectric layer 606 is carried out in the same process chamber used to form first dielectric layer 602 and the charge-trapping layer, without removing substrate 600 from the process chamber between process steps. In one embodiment, the second radical oxidation process is carried out following a nitrogen or argon purge of the process chamber following the deposition of the charge-trapping layer.

Second dielectric layer 606 may be composed of a material and have a thickness suitable to maintain a barrier to charge leakage without significantly decreasing the capacitance of a subsequently formed gate stack in a nonvolatile charge trap memory device. Second dielectric layer 606 may be referred to in the art as a blocking dielectric layer or a top dielectric layer. In accordance with an embodiment of the present invention, second dielectric layer 606 is formed by consuming region 604B of the charge-trapping layer formed in operation 508, described in association with FIG. 6C. Thus, in one embodiment, region 604B is consumed to provide second dielectric layer 606, while region 604A remains a charge-trapping layer 604. In a specific embodiment, region 604B is a silicon-rich silicon oxy-nitride region having a thickness approximately in the range of 2-3 nanometers and is oxidized to form second dielectric layer 606 having a thickness approximately in the range of 3.5-4.5 nanometers. In that embodiment, second dielectric layer 606 is composed of silicon dioxide. In accordance with an embodiment of the present invention, second dielectric layer 606 is formed by a second radical oxidation process, similar to the radical oxidation process carried out to form blocking dielectric layer 406, described in association with FIG. 4B. In one embodiment, referring to operation 512 of Flowchart 500, subsequent to forming second dielectric layer 606, second dielectric layer 606 is further subjected to a nitridation process similar to the nitridation process described in association with operation 506 from Flowchart 500. In a specific embodiment, the nitridation occurs following a nitrogen or argon purge of the process chamber following the second radical oxidation process. Alternatively, this nitridation step may be skipped. In accordance with an embodiment of the present invention, no additional deposition processes are used in the formation of second dielectric layer 606.

Figure 6E:
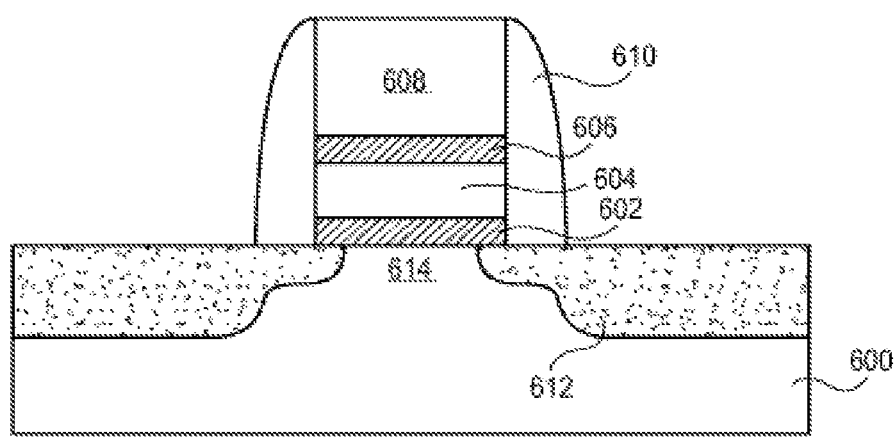
FIG. 6E illustrates a cross-sectional view of a nonvolatile charge trap memory device, in accordance with an embodiment of the present invention.

Thus, in accordance with an embodiment of the present invention, an ONO stack including first dielectric layer 602, charge-trapping layer 604 and second dielectric layer 606 is formed in a single pass in a process chamber. By fabricating these layers in a single pass of multiple wafers in the process chamber, high throughput requirements may be met while still ensuring the formation of very high quality films. Upon fabrication of an ONO stack including first dielectric layer 602, charge-trapping layer 604 and second dielectric layer 606, a nonvolatile charge trap memory device may be fabricated to include a patterned portion of the ONO stack. FIG. 6E illustrates a cross-sectional view of a nonvolatile charge trap memory device, in accordance with an embodiment of the present invention.

Referring to FIG. 6E, a nonvolatile charge trap memory device includes a patterned portion of the ONO stack formed over substrate 600. The ONO stack includes first dielectric layer 602, charge-trapping layer 604 and second dielectric layer 606. A gate layer 608 is disposed on second dielectric layer 606. The nonvolatile charge trap memory device further includes source and drain regions 612 in substrate 600 on either side of the ONO stack, defining a channel region 614 in substrate 600 underneath the ONO stack. A pair of dielectric spacers 610 isolates the sidewalls of first dielectric layer 602, charge-trapping layer 604, second dielectric layer 606 and gate layer 608. In a specific embodiment, channel region 614 is doped P-type and, in an alternative embodiment, channel region 614 is doped N-type.

In accordance with an embodiment of the present invention, the nonvolatile charge trap memory device described in association with FIG. 6E is a SONOS-type device. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. Thus, in accordance with an embodiment of the present invention, first dielectric layer 602 is a tunnel dielectric layer and second dielectric layer 606 is a blocking dielectric layer.

Gate layer 608 may be composed of any conductor or semiconductor material suitable for accommodating a bias during operation of a SONOS-type transistor. In accordance with an embodiment of the present invention, gate layer 608 is formed by a chemical vapor deposition process and is composed of doped poly-crystalline silicon. In another embodiment, gate layer 608 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Source and drain regions 612 in substrate 600 may be any regions having opposite conductivity to channel region 614. For example, in accordance with an embodiment of the present invention, source and drain regions 612 are N-type doped regions while channel region 614 is a P-type doped region. In one embodiment, substrate 600 and, hence, channel region 614, is composed of boron-doped single-crystal silicon having a boron concentration in the range of $1 \times 10^{15}$-$1 \times 10^{19}$ atoms/cm$^3$. In that embodiment, source and drain regions 612 are composed of phosphorous- or arsenic doped regions having a concentration of N-type dopants in the range of $5 \times 10^{16}$-$5 \times 10^{19}$ atoms/cm$^3$. In a specific embodiment, source and drain regions 612 have a depth in substrate 600 in the range of 80-200 nanometers. In accordance with an alternative embodiment of the present invention, source and drain regions 612 are P-type doped regions while channel region 614 is an N-type doped region.

Figure 7A:
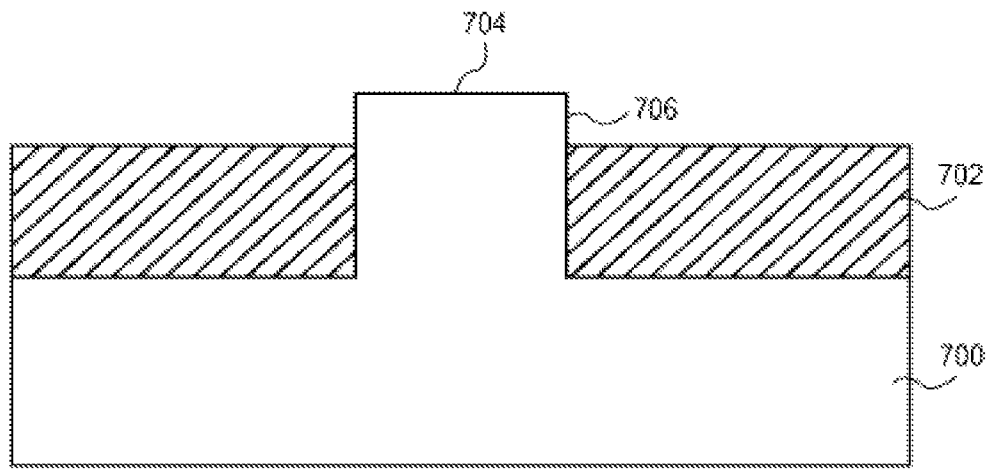
FIG. 7A illustrates a cross-sectional view of a substrate including first and second exposed crystal planes, in accordance with an embodiment of the present invention.

In another aspect of the present invention, a dielectric layer formed by radical oxidation of the top surface of a substrate in an oxidation chamber may be less susceptible to crystal plane orientation differences in the substrate upon which it is grown. For example, in one embodiment, the cornering effect caused by differential crystal plane oxidation rates is significantly reduced by forming a dielectric layer by a radical oxidation process. FIG. 7A illustrates a cross-sectional view of a substrate including first and second exposed crystal planes, in accordance with an embodiment of the present invention.

Referring to FIG. 7A, a substrate 700 has isolation regions 702 formed thereon. Substrate 700 may be composed of a material described in association with substrate 600 from FIG. 6A. Isolation regions 702 may be composed of an insulating material suitable for adhesion to substrate 700. An exposed portion of substrate 700 extends above the top surface of isolation regions 702. In accordance with an embodiment of the present invention, the exposed portion of substrate 700 has a first exposed crystal plane 704 and a second exposed crystal plane 706. In one embodiment, the crystal orientation of first exposed crystal plane 704 is different from the crystal orientation of second exposed crystal plane 706. In a specific embodiment, substrate 700 is composed of silicon, first exposed crystal plane 704 has <100> orientation, and second exposed crystal plane 706 has <110> orientation.

Figure 7B:
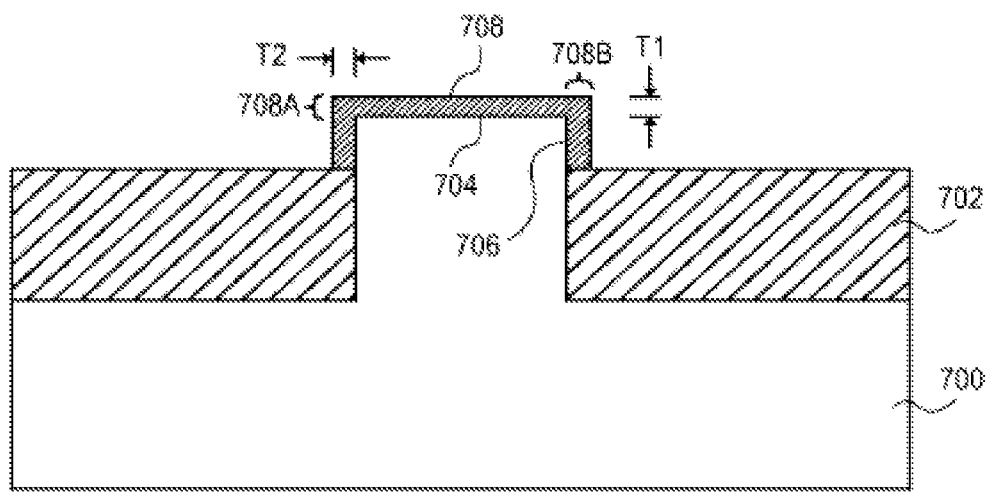
FIG. 7B illustrates a cross-sectional view of the substrate including first and second crystal planes and having a dielectric layer formed thereon, in accordance with an embodiment of the present invention.

Substrate 700 may be subjected to a radical oxidation process to form a dielectric layer by consuming (oxidizing) the top surface of substrate 700. In one embodiment, the oxidizing of substrate 700 by a radical oxidation process includes oxidizing with a radical selected from the group consisting of an OH radical, an HO2 radical or an O diradical. FIG. 7B illustrates a cross-sectional view of substrate 700 including first and second crystal planes 704 and 706, respectively, and having a dielectric layer 708 formed thereon, in accordance with an embodiment of the present invention. In an embodiment, first portion 708A of dielectric layer 708 is formed on first exposed crystal plane 704 and a second portion 708B of dielectric layer 708 is formed on second exposed crystal plane 706, as depicted in FIG. 7B. In one embodiment, the thickness T1 of first portion 708A of dielectric layer 708 is approximately equal to the thickness T2 of second portion 708B of dielectric layer 708, even though the crystal plane orientation of first exposed crystal plane 704 and second exposed crystal plane 706 differ. In a specific embodiment, the radical oxidation of substrate 700 is carried out at a temperature approximately in the range of 600-900 degrees Celsius. In a specific embodiment, the radical oxidation of substrate 700 is carried out at a temperature approximately in the range of 700-800 degrees Celsius at a pressure approximately in the range of 0.5-5 Torr.

Thus, a method for fabricating a nonvolatile charge trap memory device has been disclosed. In accordance with an embodiment of the present invention, a substrate is provided having a charge-trapping layer disposed thereon. A portion of the charge-trapping layer is then oxidized to form a blocking dielectric layer above the charge-trapping layer by exposing the charge-trapping layer to a radical oxidation process.

In another aspect of the present invention, it may be desirable to use a cluster tool to carry out a radical oxidation process. Accordingly, disclosed herein is a method to fabricate a nonvolatile charge trap memory device. A substrate may first be subjected to a first radical oxidation process to form a first dielectric layer in a first process chamber of a cluster tool. In one embodiment, a charge-trapping layer is then deposited above the first dielectric layer in a second process chamber of the cluster tool. The charge-trapping layer may then be subjected to a second radical oxidation process to form a second dielectric layer above the charge-trapping layer. In one embodiment, the second dielectric layer is formed by oxidizing a portion of the charge-trapping layer in the first process chamber of the cluster tool. In a specific embodiment, the cluster tool is a single-wafer cluster tool.

Formation of a dielectric layer in a chamber of a cluster tool may permit the growth of the dielectric layer at temperatures higher than normally achievable in batch processing chambers. Furthermore, a radical oxidation process may be carried out in the chamber of the cluster tool as the primary pathway for growing the dielectric layer. In accordance with an embodiment of the present invention, a radical oxidation process involving flowing hydrogen (H2) and oxygen (O2) gas into an oxidation chamber of a cluster tool is carried out to effect growth of a dielectric layer by oxidation consumption of an exposed substrate or film. In one embodiment, multiple radical oxidation processes are carried out in an oxidation chamber of a cluster tool to provide a tunnel dielectric layer and a blocking dielectric layer for a non-volatile charge trap memory device. These dielectric layers may be of very high quality, even at a reduced thickness. In one embodiment, the tunnel dielectric layer and the blocking dielectric layer are both denser and are composed of substantially fewer hydrogen atoms/cm3 than a tunnel dielectric layer or a blocking dielectric layer formed in a batch process chamber. Furthermore, the substrate upon which a tunnel dielectric layer and a blocking dielectric layer are formed may be exposed to a shorter temperature ramp rate and stabilization time in an oxidation chamber of a cluster tool as compared with a batch process chamber. Thus, in accordance with an embodiment of the present invention embodiment, the impact on the thermal budget of the substrate is reduced by employing a radical oxidation process in an oxidation chamber of a cluster tool. In accordance with another embodiment of the present invention, a dielectric layer formed by carrying out a radical oxidation process in an oxidation chamber of a cluster tool is less susceptible to crystal plane orientation differences in the substrate from which it is grown. In one embodiment, the cornering effect caused by differential crystal plane oxidation rates is significantly reduced by forming a dielectric layer via a radical oxidation process carried out in an oxidation chamber of a cluster tool.

Figure 8:
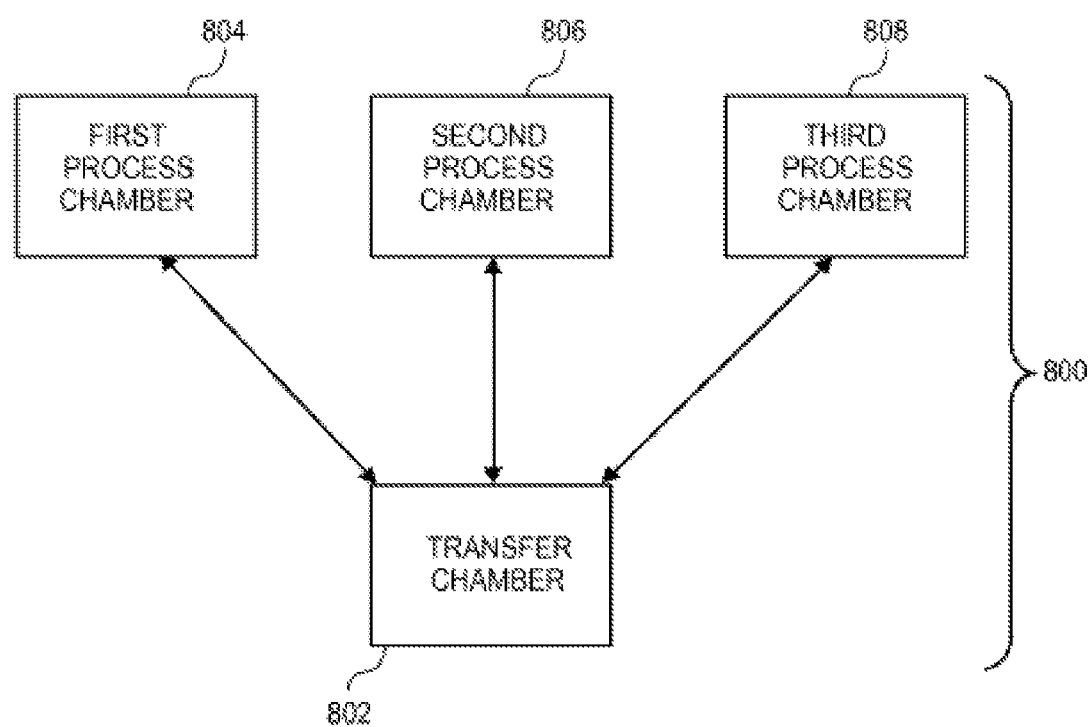
FIG. 8 illustrates an arrangement of process chambers in a cluster tool, in accordance with an embodiment of the present invention.

A portion of a nonvolatile charge trap memory device may be fabricated in a cluster tool. FIG. 8 illustrates an arrangement of process chambers in a cluster tool, in accordance with an embodiment of the present invention. Referring to FIG. 8, an arrangement of process chambers in a cluster tool 800 includes a transfer chamber 802, a first process chamber 804, a second process chamber 806 and a third process chamber 808. In an embodiment, transfer chamber 802 is for receiving a wafer from an external environment for introduction into cluster tool 800. In one embodiment, each of the process chambers 802, 804 and 806 are arranged in a way such that a wafer may be passed back-and forth between these chambers and transfer chamber 802, as depicted by the double-headed arrows in FIG. 8. In accordance with an additional embodiment of the present invention, although not shown, cluster tool 800 may be configured such that a wafer can be transferred directly between any pairing of process chambers 802, 804 or 806.

Cluster tool 800 may be any cluster tool for which an outside environment is excluded in and between process chambers 804, 806 and 808 and transfer chamber 802. Thus, in accordance with an embodiment of the present invention, once a wafer has entered process chamber 802, it is protected from an external environment as it is moved into and between process chambers 804, 806 and 808 and transfer chamber 802. An example of such a cluster tool is the Centura® platform commercially available from Applied Materials, Inc., located in Santa Clara, Calif. In one embodiment, once a wafer has been received by transfer chamber 802, a vacuum of less than approximately 100 mTorr is maintained in cluster tool 800. In accordance with an embodiment of the present invention, cluster tool 800 incorporates a chuck (or multiple chucks, e.g., one chuck for each chamber) upon which the flat surface, as opposed to the edge surface, of a wafer rests on the chuck for processing and transfer events. In one embodiment, by having the flat surface of a wafer rest on the chuck, more rapid ramp rates for heating the wafer are achievable by heating the wafer via the chuck. In a specific embodiment, cluster tool 800 is a single-wafer cluster tool.

Process chambers 802, 804 and 806 may include, but are not limited to, oxidation chambers, low-pressure chemical vapor deposition chambers, or a combination thereof. For example, in accordance with an embodiment of the present invention, first process chamber 804 is a first oxidation chamber, second process chamber 806 is a low-pressure chemical vapor deposition chamber, and third process chamber 808 is a second oxidation chamber. An example of an oxidation chamber is the In-Situ Steam Generation (ISSG) chamber from Applied Materials, Inc. Examples of low-pressure chemical vapor deposition chambers include a SiNgen™ chamber and an OXYgen™ chamber from Applied Materials, Inc. Instead of heating entire process chambers to heat a wafer, which is the case for typical batch process chambers, a chuck used for carrying a single wafer may be heated to heat the wafer. In accordance with an embodiment of the present invention, a chuck is used to heat a wafer to the desired process temperature. Thus, relatively short temperature ramp times and stabilization times may be achieved.

Figure 9:
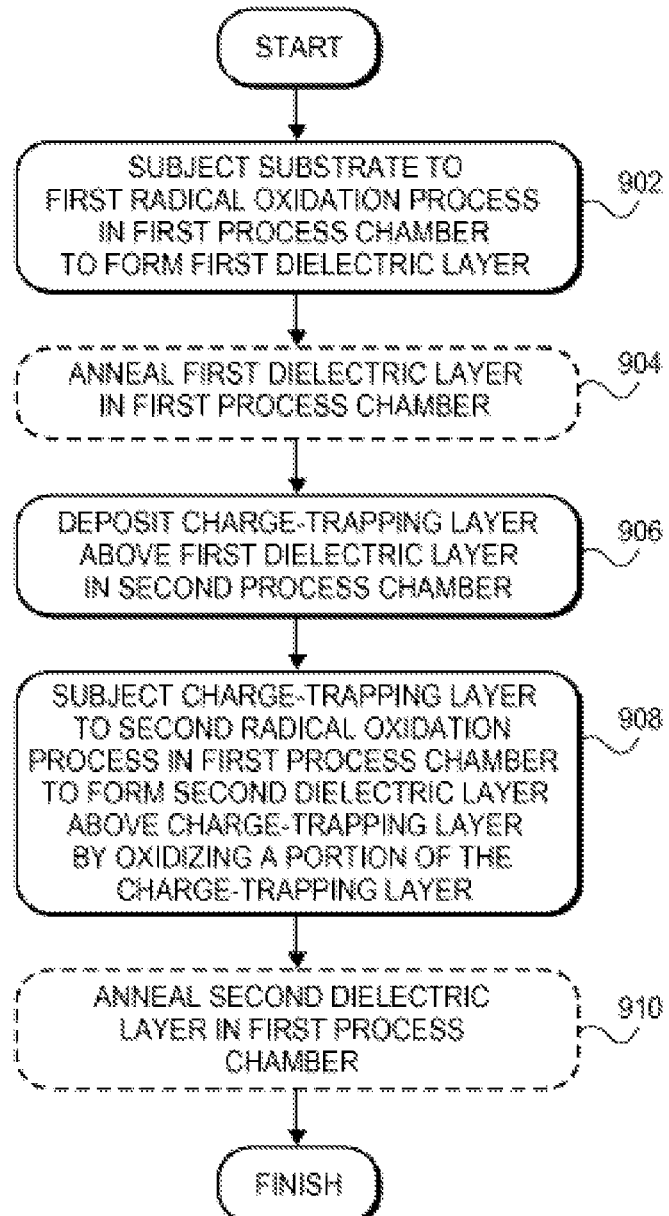
FIG. 9 depicts a Flowchart representing a series of operations in a method for fabricating a nonvolatile charge trap memory device, in accordance with an embodiment of the present invention.

A portion of a nonvolatile charge trap memory device may be fabricated in a cluster tool. FIG. 9 depicts a Flowchart 900 representing a series of operations in a method for fabricating a nonvolatile charge trap memory device, in accordance with an embodiment of the present invention. FIGS. 10A-10E illustrates cross-sectional views representing operations in the fabrication of a nonvolatile charge trap memory device, in accordance with an embodiment of the present invention.

Figure 10A:
FIG. 10A illustrates a cross-sectional view of a substrate, in accordance with an embodiment of the present invention.

Referring to FIG. 10A, a substrate 1000 is provided in a cluster tool. In one embodiment, substrate 1000 is provided in a transfer chamber, such as transfer chamber 802 described in association with FIG. 8.

Substrate 1000 may be composed of any material suitable for semiconductor device fabrication. In one embodiment, substrate 1000 is a bulk substrate composed of a single crystal of a material which may include, but is not limited to, silicon, germanium, silicon-germanium or a III-V compound semiconductor material. In another embodiment, substrate 1000 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 1000 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 1000 may further include dopant impurity atoms.

Figure 10B:
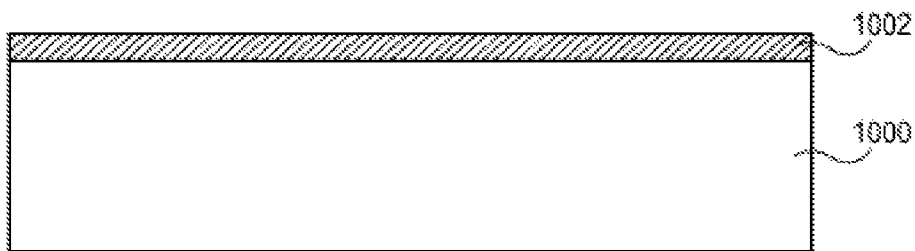
FIG. 10B illustrates a cross-sectional view of a substrate having a tunnel dielectric layer formed thereon, corresponding to operation 402 from the Flowchart of FIG. 4, in accordance with an embodiment of the present invention.

FIG. 10B illustrates a cross-sectional view of a substrate having a tunnel dielectric layer formed thereon, corresponding to operation 902 from the Flowchart of FIG. 9, in accordance with an embodiment of the present invention. Referring to operation 902 of Flowchart 900 and corresponding FIG. 10B, substrate 1000 is subjected to a first radical oxidation process in a first process chamber of the cluster tool to form a first dielectric layer 1002.

First dielectric layer 1002 may be composed of a material and have a thickness suitable to allow charge carriers to tunnel into a subsequently formed charge trapping layer under an applied gate bias, while maintaining a suitable barrier to leakage when a subsequently formed nonvolatile charge trap memory device is unbiased. In accordance with an embodiment of the present invention, first dielectric layer 1002 is formed by an oxidation process where the top surface of substrate 1000 is consumed. Thus, in an embodiment, first dielectric layer 1002 is composed of an oxide of the material of substrate 1000. For example, in one embodiment, substrate 1000 is composed of silicon and first dielectric layer 1002 is composed of silicon dioxide. In a specific embodiment, first dielectric layer 1002 is formed to a thickness approximately in the range of 1-10 nanometers. In a particular embodiment, first dielectric layer 1002 is formed to a thickness approximately in the range of 1.5-2.5 nanometers.

First dielectric layer 1002 may be formed by a radical oxidation process. In accordance with an embodiment of the present invention, the radical oxidation process involves flowing hydrogen (Hz) and oxygen (Oz) gas into an oxidation chamber, such as the oxidation chambers 804 or 808 described in association with FIG. 8. In one embodiment, the partial pressures of Hz and Oz have a ratio to one another approximately in the range of 1:50-1:5. However, in an embodiment, an ignition event is not carried out which would otherwise typically be used to pyrolyze the Hz and Oz to form steam. Instead, Hz and Oz are permitted to react to form radicals at the surface of substrate 1000. In one embodiment, the radicals are used to consume the top portion of substrate 1000 to provide first dielectric layer 1002. In a specific embodiment, the radical oxidation process includes oxidizing with a radical such as, but not limited to, an OH radical, an $HO_2$ radical or an O diradical. In a particular embodiment, the radical oxidation process is carried out at a temperature approximately in the range of 950-1100 degrees Celsius at a pressure approximately in the range of 5-15 Torr. In one embodiment, the radical oxidation process is carried out for a duration of approximately in the range of 1-3 minutes. In accordance with an embodiment of the present invention, first dielectric layer 1002 is formed as a high-density, low-hydrogen-content film.

Referring to operation 904 of Flowchart 900, subsequent to forming first dielectric layer 1002, but prior to any further processing, first dielectric layer 1002 may be subjected to a nitridation process. In an embodiment, the nitridation process is carried out in the same process chamber used to form first dielectric layer 1002. In one embodiment, first dielectric layer 1002 is annealed in the first process chamber, wherein the annealing includes heating substrate 1000 in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen (N2), nitrous oxide (N2O), nitrogen dioxide (NO2), nitric oxide (NO) or ammonia (NH3). In another embodiment, the nitridation occurs in a separate process chamber. Alternatively, this nitridation step may be skipped.

Figure 10C:
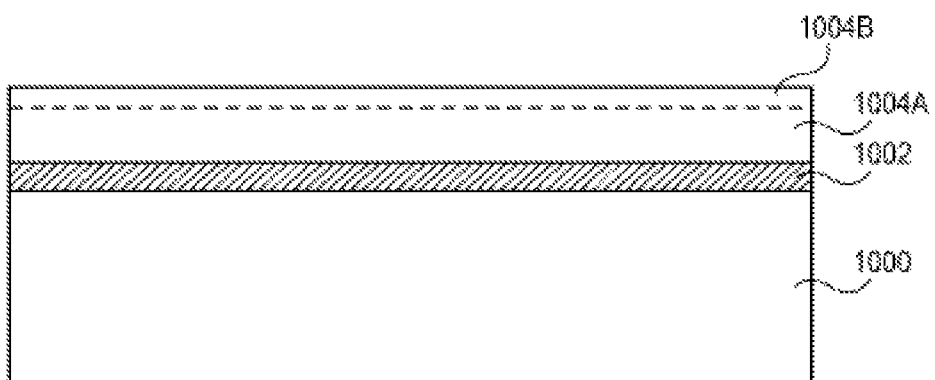
FIG. 10C illustrates a cross-sectional view of a substrate having a charge-trapping layer formed thereon, corresponding to operation 406 from the Flowchart of FIG. 4, in accordance with an embodiment of the present invention.

FIG. 10C illustrates a cross-sectional view of a substrate having a charge-trapping layer formed thereon, corresponding to operation 906 from the Flowchart of FIG. 9, in accordance with an embodiment of the present invention. Referring to operation 906 of Flowchart 900 and corresponding FIG. 10C, a charge-trapping layer having a first region 1004A and a second region 1004B is formed on first dielectric layer 1002 in the second process chamber of a cluster tool.

The charge-trapping layer may be composed of a material and have a thickness suitable to store charge and, hence, change the threshold voltage of a subsequently formed gate stack. In accordance with an embodiment of the present invention, the charge-trapping layer is composed of two regions 1004A and 1004B, as depicted in FIG. 10C. In an embodiment, region 1004A of the charge-trapping layer will remain as an intact charge-trapping layer following subsequent process operations. However, in that embodiment, region 1004 B of the as-formed charge-trapping layer will be consumed to form a second dielectric layer, above region 1004A. In one embodiment, regions 1004A and 1004B of the charge-trapping layer are formed in the same process step and are composed of the same material.

The charge-trapping layer having regions 1004A and 1004B may be formed by a chemical vapor deposition process. In accordance with an embodiment of the present invention, the charge-trapping layer is composed of a material such as, but not limited to, silicon nitride, silicon oxy-nitride, oxygen-rich silicon oxy-nitride or silicon-rich silicon oxynitride. In an embodiment, the charge-trapping layer is formed on first dielectric layer 1002 in a low-pressure chemical vapor deposition chamber, such as the SiNgen™ low-pressure chemical vapor deposition chamber described in association with process chamber 806 from FIG. 8. In one embodiment, the second process chamber is a low-pressure chemical vapor deposition chamber and regions 1004A and 1004B of the charge-trapping layer are formed at a temperature less than the temperature used to form first dielectric layer 1002. In a specific embodiment, regions 1004A and 1004B of the charge-trapping layer are formed at a temperature approximately in the range of 700-850 degrees Celsius. In an embodiment, the second process chamber is a low-pressure chemical vapor deposition chamber and the charge-trapping layer is formed by using gases such as, but not limited to, dichlorosilane ($H_2SiCl_2$), bis-(tert-butylamino) silane (BTBAS), ammonia ($NH_3$) or nitrous oxide ($N_2O$). In accordance with an embodiment of the present invention, the charge-trapping layer is formed to a total thickness approximately in the range of 5-15 nanometers and region 1004 B accounts for a thickness approximately in the range of 2-3 nanometers of the total thickness of the charge-trapping layer. In that embodiment, region 1004A accounts for the remaining total thickness of the charge-trapping layer, i.e. the portion of the charge-trapping layer that is not subsequently consumed to form a top or blocking dielectric layer.

In another aspect of the present invention, the charge-trapping layer may include multiple composition regions. For example, in accordance with an embodiment of the present invention, the charge-trapping layer includes an oxygen-rich portion and a silicon-rich portion and is formed by depositing an oxygen-rich oxy-nitride film by a first composition of gases in the second process chamber and, subsequently, depositing a silicon-rich oxy-nitride film by a second composition of gases in the second process chamber. In one embodiment, the charge-trapping layer is formed by modifying the flow rate of ammonia (NH3) gas, and introducing nitrous oxide (N2O) and dichlorosilane (SiH2Cb) to provide the desired gas ratios to yield first an oxygen-rich oxy-nitride film and then a silicon-rich oxy-nitride film. In a specific embodiment, the oxygen-rich oxynitride film is formed by introducing a process gas mixture including N2O, NH3 and SiH2Cl2, while maintaining the chamber at a pressure approximately in the range of 0.5-500 Torr, and maintaining substrate 1000 at a temperature approximately in the range of 700-850 degrees Celsius, for a period approximately in the range of 2.5-20 minutes. In a further embodiment, the process gas mixture includes N2O and NH3 having a ratio of from about 8:1 to about 1:8 and SiH2Cl2 and NH3 having a ratio of from about 1:7 to about 7:1, and can be introduced at a flow rate approximately in the range of 5-200 standard cubic centimeters per minute (sccm). In another specific embodiment, the silicon-rich oxy-nitride film is formed by introducing a process gas mixture including N2O, NH3 and SiH2Cl2, while maintaining the chamber at a pressure approximately in the range of 0.5-500 Torr, and maintaining substrate 1000 at a temperature approximately in the range of 700-850 degrees Celsius, for a period approximately in the range of 2.5-20 minutes. In a further embodiment, the process gas mixture includes N2O and NH3 having a ratio of from about 8:1 to about 1:8 and SiH2Cl2 and NH3 mixed in a ratio of from about 1:7 to about 7:1, introduced at a flow rate of from about 5 to about 20 sccm. In accordance with an embodiment of the present invention, the charge-trapping layer comprises a bottom oxygen-rich silicon oxy-nitride portion having a thickness approximately in the range of 2.5-3.5 nanometers and a top silicon-rich silicon oxynitride portion having a thickness approximately in the range of 9-10 nanometers. In one embodiment, a region 1004B of charge-trapping layer accounts for a thickness approximately in the range of 2-3 nanometers of the total thickness of the top silicon-rich silicon oxy-nitride portion of the charge-trapping layer. Thus, region 1004B, which is targeted for subsequent consumption to form a second dielectric layer, may be composed entirely of silicon-rich silicon oxy-nitride.

Figure 10D:
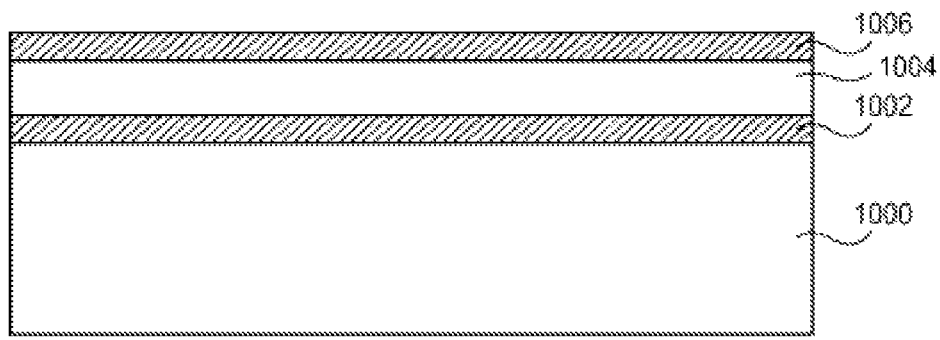
FIG. 10D illustrates a cross-sectional view of a substrate having a top dielectric layer formed thereon, corresponding to operation 408 from the Flowchart of FIG. 4, in accordance with an embodiment of the present invention.

FIG. 10D illustrates a cross-sectional view of a substrate having a top dielectric layer formed thereon, corresponding to operation 908 from the Flowchart of FIG. 9, in accordance with an embodiment of the present invention. Referring to operation 908 of Flowchart 900 and corresponding FIG. 10D, a second dielectric layer 1006 is formed on charge-trapping layer 1004 in the first process chamber of the cluster tool.

Second dielectric layer 1006 may be composed of a material and have a thickness suitable to maintain a barrier to charge leakage without significantly decreasing the capacitance of a subsequently formed gate stack in a non-volatile charge trap memory device. In accordance with an embodiment of the present invention, second dielectric layer 1006 is formed by consuming region 1004B of the charge trapping layer formed in operation 906, described in association with FIG. 10C. Thus, in one embodiment region 1004B is consumed to provide second dielectric layer 1006, while region 1004A remains a charge-trapping layer 1004. In a specific embodiment, region 1004B is a silicon-rich silicon oxy-nitride region having a thickness approximately in the range of 2-3 nanometers and is oxidized to form second dielectric layer 1006 having a thickness approximately in the range of 3.5-4.5 nanometers. In that embodiment, second dielectric layer 1006 is composed of silicon dioxide.

Second dielectric layer 1006 may be formed by a second radical oxidation process. In accordance with an embodiment of the present invention, the second radical oxidation process involves flowing hydrogen (H2) and oxygen (O2) gas into an oxidation chamber, such as the oxidation chambers 804 or 808 described in association with FIG. 8. In one embodiment, the partial pressures of H2 and O2 have a ratio to one another approximately in the range of 1:50-1:5. However, in an embodiment, an ignition event is not carried out which would otherwise typically be used to pyrolyze the H2 and O2 to form steam. Instead, H2 and O2 are permitted to react to form radicals at the surface of region 1004 B. In one embodiment, the radicals are used to consume region 1004 B to provide second dielectric layer 1006. In a specific embodiment, the second radical oxidation process includes oxidizing with a radical such as, but not limited to, an OH radical, an HO$_2$ radical or an O diradical. In a particular embodiment, the second radical oxidation process is carried out at a temperature approximately in the range of 950-1100 degrees Celsius at a pressure approximately in the range of 5-15 Torr. In one embodiment, the second radical oxidation process is carried out for a duration approximately in the range of 1-3 minutes. In accordance with an embodiment of the present invention, first dielectric layer 1002 is formed as a high-density, low-hydrogen content film. In one embodiment, no additional deposition step is required to form a complete second dielectric layer 1006, as depicted in FIG. 10D and shown in Flowchart 900. Depending on wafer pass-through logistics in the cluster tool, the second radical oxidation process may be carried out in the same, i.e. first, chamber as the first radical oxidation process used to form first dielectric layer 1002 or in a different, e.g. third, process chamber of the cluster tool. Thus, in accordance with an embodiment of the present invention, reference to a first process chamber can be used to mean reintroduction into the first process chamber or to mean introduction into a process chamber different from the first process chamber.

Referring to operation 910 of Flowchart 900, subsequent to forming second dielectric layer 1006, but prior to removing substrate 1000 from the cluster tool, second dielectric layer 1006 may be further subjected to a nitridation process in the first process chamber. In accordance with an embodiment of the present invention, the nitridation process includes annealing second dielectric layer 1006 in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen (N2), nitrous oxide (N2O), nitrogen dioxide (NO2), nitric oxide (NO) or ammonia (NH3). Alternatively, this nitridation step, i.e. operation 910 from Flowchart 900, may be skipped and the wafer unloaded from the cluster tool.

Thus, in accordance with an embodiment of the present invention, an ONO stack including first dielectric layer 1002, charge-trapping layer 1004 and second dielectric layer 1006 is formed in a single pass in a cluster tool. By fabricating these layers in a single pass in the cluster tool, pristine interfaces between first dielectric layer 1002 and charge-trapping layer 1004 and between charge-trapping layer 1004 and second dielectric layer 1006 may be preserved. In one embodiment, first dielectric layer 1002, charge-trapping layer 1004 and second dielectric layer 1006 are formed without breaking vacuum in the cluster tool. In one embodiment, each layer is formed at a different temperature to tailor film properties without incurring significant ramp time penalties. Furthermore, by fabricating these layers in a cluster tool, as opposed to fabricating in batch processing tools, the overall uniformity of the stack of layers may be optimized. For example, in accordance with an embodiment of the present invention, by fabricating layers 1002, 1004 and 1006 in a cluster tool, the variability in thickness of the stack of layers 1002, 1004 and 1006 across a single wafer may be reduced by as much as approximately 30%. In an exemplary embodiment, 1 cr is approximately in the range of 1-2% of the thickness of first dielectric layer 1002. In a specific embodiment, the cluster tool is a single-wafer cluster tool.

Figure 10E:
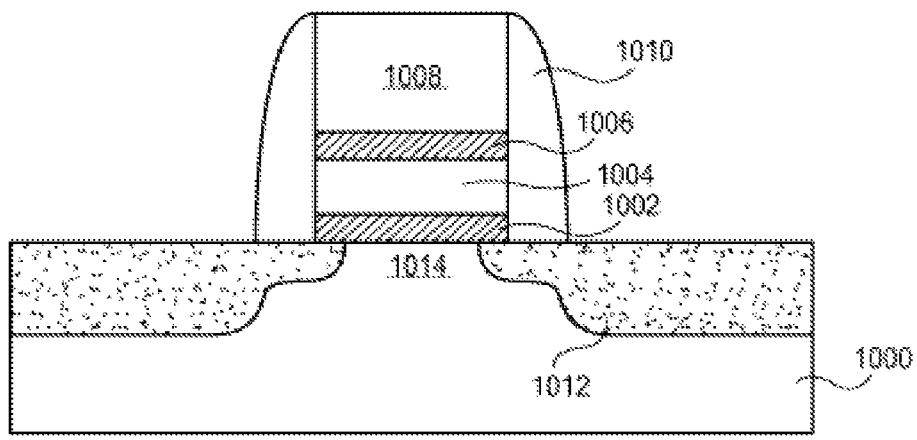
FIG. 10E illustrates a cross-sectional view of a nonvolatile charge trap memory device, in accordance with an embodiment of the present invention.

Upon fabrication of an ONO stack including first dielectric layer 1002, charge-trapping layer 1004 and second dielectric layer 1006, a nonvolatile charge trap memory device may be fabricated to include a patterned portion of the ONO stack. FIG. 10E illustrates a cross-sectional view of a nonvolatile charge trap memory device, in accordance with an embodiment of the present invention.

Referring to FIG. 10E, a nonvolatile charge trap memory device includes a patterned portion of the ONO stack formed over substrate 1000. The ONO stack includes first dielectric layer 1002, charge-trapping layer 1004 and second dielectric layer 1006. A gate layer 1008 is disposed on second dielectric layer 1006. The nonvolatile charge trap memory device further includes source and drain regions 1012 in substrate 1000 on either side of the ONO stack, defining a channel region 1014 in substrate 1000 underneath the ONO stack. A pair of dielectric spacers 1010 isolates the sidewalls of first dielectric layer 1002, charge-trapping layer 1004, second dielectric layer 1006 and gate layer 1008. In a specific embodiment, channel region 1014 is doped P-type and, in an alternative embodiment, channel region 1014 is doped N-type.

In accordance with an embodiment of the present invention, the nonvolatile charge trap memory device described in association with FIG. 10E is a SONOS-type device. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. Thus, in accordance with an embodiment of the present invention, first dielectric layer 1002 is a tunnel dielectric layer and second dielectric layer 1006 is a blocking dielectric layer.

Gate layer 1008 may be composed of any conductor or semiconductor material suitable for accommodating a bias during operation of a SON OS-type transistor. In accordance with an embodiment of the present invention, gate layer 1008 is formed by a chemical vapor deposition process and is composed of doped poly-crystalline silicon. In another embodiment, gate layer 1008 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Source and drain regions 1012 in substrate 1000 may be any regions having opposite conductivity to channel region 1014. For example, in accordance with an embodiment of the present invention, source and drain regions 1012 are N-type doped regions while channel region 1014 is a P-type doped region. In one embodiment, substrate 1000 and, hence, channel region 1014, is composed of boron-doped single crystal silicon having a boron concentration in the range of $1\times10^{15}$-$1\times10^{19}$ atoms/cm$^3$. In that embodiment, source and drain regions 1012 are composed of phosphorous- or arsenic-doped regions having a concentration of N-type dopants in the range of $5\times10^{16}$-$5\times10^{19}$ atoms/cm$^3$. In a specific embodiment, source and drain regions 1012 have a depth in substrate 1000 in the range of 80-200 nanometers. In accordance with an alternative embodiment of the present invention, source and drain regions 1012 are P-type doped regions while channel region 1014 is an-N-type doped region.

Figure 11:
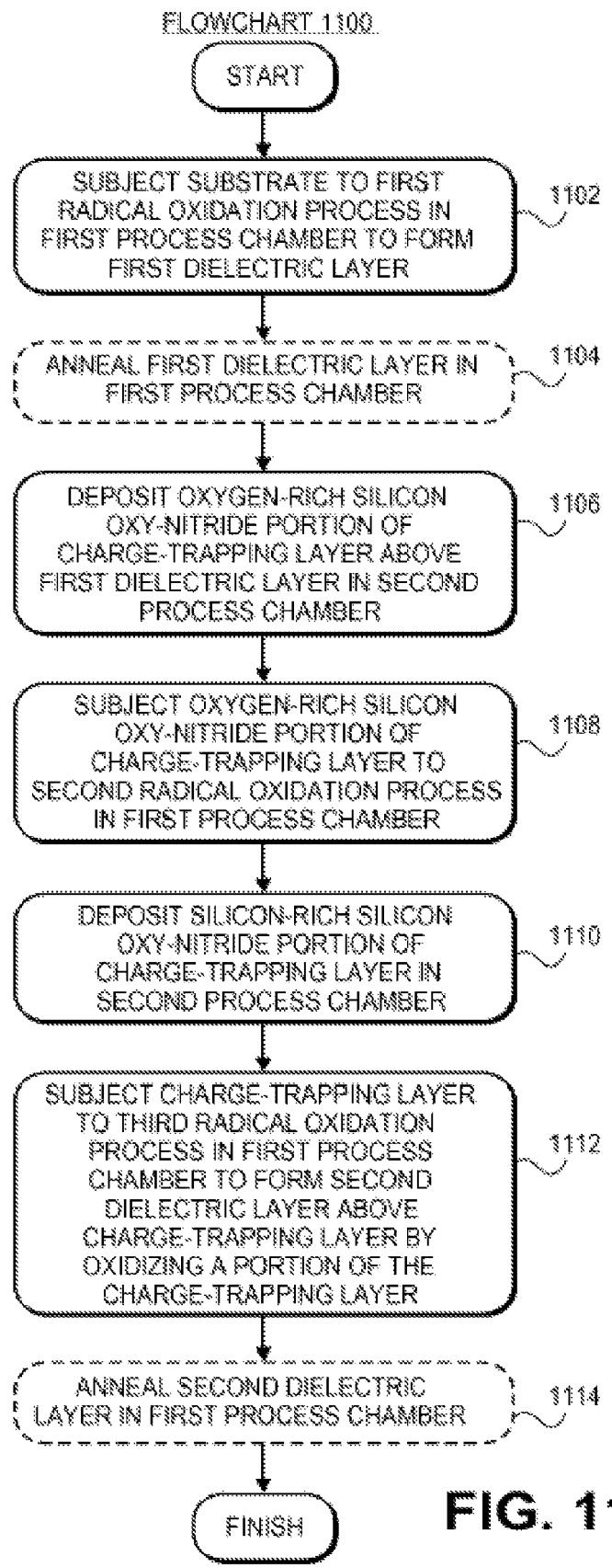
FIG. 11 depicts a Flowchart representing a series of operations in a method for fabricating a nonvolatile charge trap memory device, in accordance with an embodiment of the present invention.

In another aspect of the present invention, a charge-trapping layer may include multiple composition regions, where the composition region closest to a tunnel dielectric layer is subjected to a radical oxidation process. FIG. 11 depicts a Flowchart 1100 representing a series of operations in a method for fabricating a nonvolatile charge trap memory device, in accordance with an embodiment of the present invention. FIGS. 12A-12E illustrate cross-sectional views representing operations in the fabrication of a nonvolatile charge trap memory device, in accordance with an embodiment of the present invention.

Figure 12A:
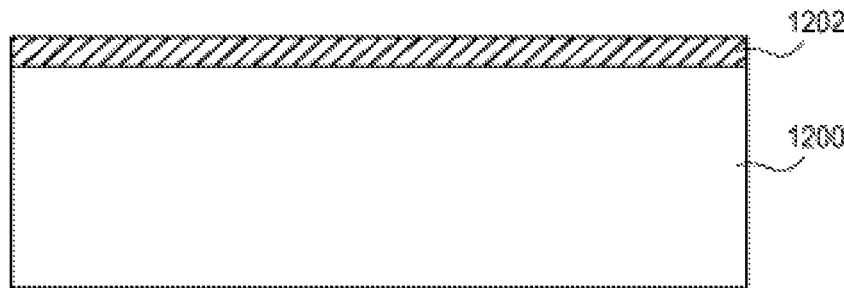
FIG. 12A illustrates a cross-sectional view of a substrate having a tunnel dielectric layer formed thereon, corresponding to operation 602 from the Flowchart of FIG. 6, in accordance with an embodiment of the present invention.

FIG. 12A illustrates a cross-sectional view of a substrate having a first dielectric layer formed thereon, corresponding to operation 1102 from the Flowchart of FIG. 11, in accordance with an embodiment of the present invention. Referring to operation 1102 of Flowchart 1100 and corresponding FIG. 12A, substrate 1200 is subjected to a first radical oxidation process in a first process chamber of a cluster tool to form a first dielectric layer 1202. Substrate 1200 and first dielectric layer 1202 may be composed of materials described in association with substrate 1000 and first dielectric layer 1002 from FIGS. 10A and 10B, respectively. The radical oxidation process used to form first dielectric layer 1202 may be similar to the radical oxidation process used to form first dielectric layer 1002, described in association with FIG. 10B.

Referring to operation 1104 of Flowchart 1100, subsequent to forming first dielectric layer 1202, but prior to any further processing, first dielectric layer 1202 may be subjected to a nitridation process. The nitridation process may be similar to the nitridation process described in association with operation 904 of Flowchart 900. In one embodiment, the nitridation process is carried out in the same process chamber used to form first dielectric layer 1202. In another embodiment, the nitridation occurs in a separate process chamber. Alternatively, this nitridation step may be skipped.

Figure 12B:
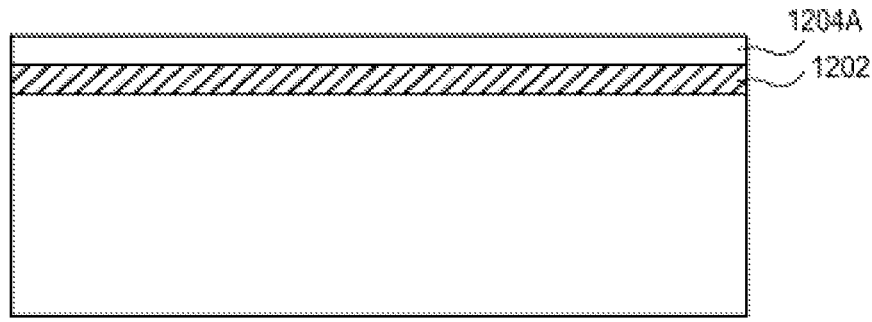
FIG. 12B illustrates a cross-sectional view of a substrate having an oxygen-rich silicon oxy-nitride portion of a charge-trapping layer formed thereon, corresponding to operation 606 from the Flowchart of FIG. 6, in accordance with an embodiment of the present invention.

FIG. 12B illustrates a cross-sectional view of a substrate having an oxygen-rich silicon oxy-nitride portion of a charge-trapping layer formed thereon, corresponding to operation 1106 from the Flowchart of FIG. 11, in accordance with an embodiment of the present invention. Referring to operation 1106 of Flowchart 1100 and corresponding FIG. 12B, an oxygen-rich silicon oxy-nitride portion 1204A is formed on first dielectric layer 1202 in a second process chamber of the cluster tool. Oxygen-rich silicon oxy-nitride portion 1204A may be composed of an oxygen-rich silicon oxynitride material and formed by a technique described in association with first region 1004A from FIG. 10C.

Referring to operation 1108 from Flowchart 1100, in accordance with an embodiment of the present invention, oxygen-rich silicon oxy-nitride portion 1204A is subjected to a second radical oxidation process in the first process chamber of the cluster tool. The second radical oxidation process may be similar to one of the radical oxidation processes used to form first dielectric layer 1002 or second dielectric layer 1006, described in association with FIGS. 10B and 10D, respectively. In an embodiment, carrying out the second radical oxidation process is made possible because oxygen-rich silicon oxy-nitride portion 1204A is maintained in the environment within the tool and thus retains a pristine surface. In one embodiment, the second radical oxidation process densifies oxygen-rich silicon oxy-nitride portion 1204A. Depending on wafer pass-through logistics in the cluster tool, the second radical oxidation process may be carried out in the same, i.e. first, chamber as the radical oxidation process used to form first dielectric layer 1202 or in a different, e.g. third, process chamber. Thus, in accordance with an embodiment of the present invention, reference to a first process chamber can be used to mean reintroduction into the first process chamber or to mean introduction into a process chamber different from the first process chamber.

Figure 12C:
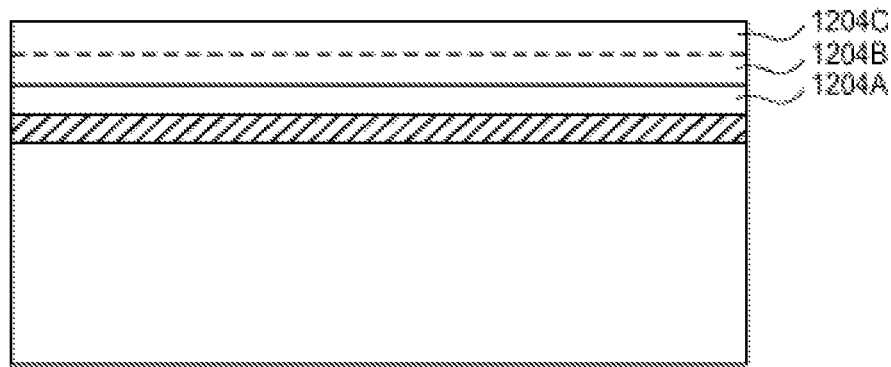
FIG. 12C illustrates a cross-sectional view of a substrate having a silicon-rich silicon oxy-nitride portion of a charge-trapping layer formed thereon, corresponding to operation 610 from the Flowchart of FIG. 6, in accordance with an embodiment of the present invention.

FIG. 12C illustrates a cross-sectional view of a substrate having a silicon-rich silicon oxy-nitride portion of a charge-trapping layer formed thereon, corresponding to operation 1110 from the Flowchart of FIG. 11, in accordance with an embodiment of the present invention. Referring to operation 1110 of Flowchart 1100 and corresponding FIG. 12C, a silicon-rich silicon oxy-nitride portion having a first region 1204B and a second region 1204C is formed on oxygen-rich silicon oxy-nitride portion 1204A in the second process chamber of the cluster tool. The silicon-rich silicon oxynitride portion may be composed of a silicon-rich silicon oxy-nitride material and formed by a technique described in association with second region 1004B from Figure 10C. Depending on wafer pass-through logistics in the cluster tool, the deposition of silicon-rich silicon oxy-nitride portion of the charge-trapping layer may be carried out in the same, i.e. second, chamber as the deposition of oxygen-rich silicon oxy-nitride portion 1204A of the charge-trapping layer or in a different process chamber. Thus, in accordance with an embodiment of the present invention, reference to a second process chamber can be used to mean reintroduction into the second process chamber or to mean introduction into a process chamber different from the second process chamber.

Figure 12D:
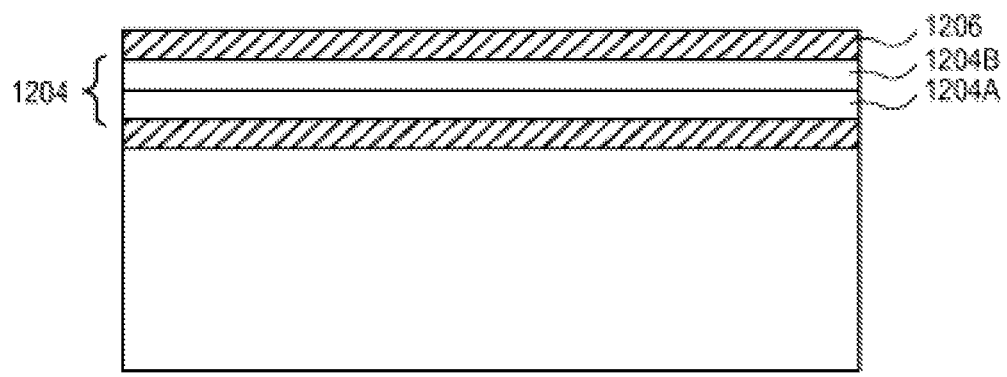
FIG. 12D illustrates a cross-sectional view of a substrate having a top dielectric layer formed thereon, corresponding to operation 612 from the Flowchart of FIG. 6, in accordance with an embodiment of the present invention.

FIG. 12D illustrates a cross-sectional view of a substrate having a top dielectric layer formed thereon, corresponding to operation 1112 from the Flowchart of FIG. 11, in accordance with an embodiment of the present invention. Referring to operation 1112 of Flowchart 1100 and corresponding FIG. 12D, a second dielectric layer 1206 is formed on charge-trapping layer 1204 in the first process chamber of the cluster tool. In accordance with an embodiment of the present invention, second dielectric layer 1206 is formed by consuming second region 1204C of the silicon-rich silicon oxy-nitride portion by a third radical oxidation process. Thus, in one embodiment, the remaining charge-trapping layer 1204 between first dielectric layer 1202 and second dielectric layer 1204 is composed of oxygen-rich silicon oxy-nitride portion 1204A and first region 1204B of the silicon-rich silicon oxy-nitride portion 1204, as depicted in FIG. 12D. The third radical oxidation process used to consume second region 1204C of the silicon-rich silicon oxy-nitride portion to provide second dielectric layer 1206 may be similar to the radical oxidation process used to form second dielectric layer 1006, described in association with FIG. 10D. Depending on wafer pass-through logistics in the cluster tool, the third radical oxidation process may be carried out in the same, i.e. first, chamber as the radical oxidation process used to form first dielectric layer 1202 or in a different, e.g. third, process chamber. Thus, in accordance with an embodiment of the present invention, reference to a first process chamber can be used to mean reintroduction into the first process chamber or to mean introduction into a process chamber different from the first process chamber.

Referring to operation 1114 of Flowchart 1100, subsequent to forming second dielectric layer 1206, but prior to removing substrate 1200 from the cluster tool, second dielectric layer 1206 may be further subjected to a nitridation process in the first process chamber. The nitridation process may be similar to the nitridation process described in association with operation 910 from Flowchart 900. In one embodiment, the nitridation process is carried out in the same process chamber used to form second dielectric layer 1206. In another embodiment, the nitridation occurs in a separate process chamber. Alternatively, this nitridation step may be skipped.

Figure 12E:
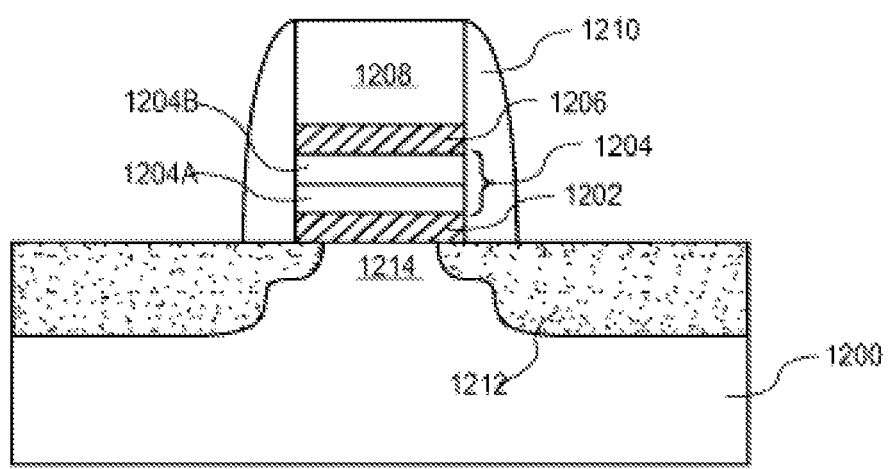
FIG. 12E illustrates a cross-sectional view of a nonvolatile charge trap memory device, in accordance with an embodiment of the present invention.

Upon fabrication of an ONO stack including first dielectric layer 1202, charge-trapping layer 1204 and second dielectric layer 1206, a nonvolatile charge trap memory device may be fabricated to include a patterned portion of the ONO stack. FIG. 12E illustrates a cross-sectional view of a nonvolatile charge trap memory device, in accordance with an embodiment of the present invention.

Referring to FIG. 12E, a nonvolatile charge trap memory device includes a patterned portion of the ONO stack formed over substrate 1200. The ONO stack includes first dielectric layer 1202, charge-trapping layer 1204 and second dielectric layer 1206. A gate layer 1208 is disposed on second dielectric layer 1206. The nonvolatile charge trap memory device further includes source and drain regions 1212 in substrate 1200 on either side of the ONO stack, defining a channel region 1214 in substrate 1200 underneath the ONO stack. A pair of dielectric spacers 1210 isolates the sidewalls of first dielectric layer 1202, charge-trapping layer 1204, second dielectric layer 1206 and gate layer 1208. In accordance with an embodiment of the present invention, charge-trapping layer 1204 is composed of an oxygen-rich silicon oxy-nitride portion 1204A and a silicon-rich silicon oxy-nitride portion 1204B, as depicted in FIG. 12E. In one embodiment, the nonvolatile charge trap memory device is a SONOS-type device. Gate layer 1208, source and drain regions 1212 and channel region 1214 may be composed of materials described in association with gate layer 1008, source and drain regions 1012 and channel region 1014 from FIG. 10E.

Figure 13A:
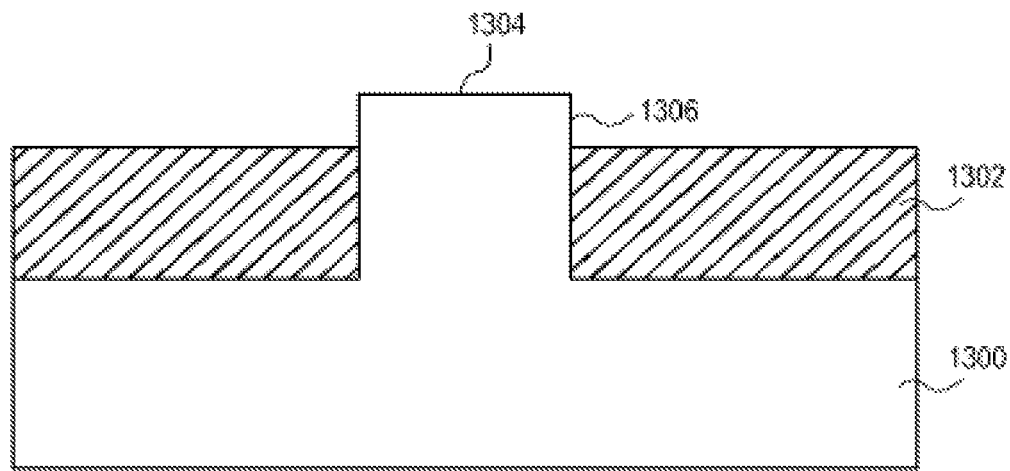
FIG. 13A illustrates a cross-sectional view of a substrate including first and second exposed crystal planes, in accordance with an embodiment of the present invention.

In another aspect of the present invention, a dielectric layer formed by radical oxidation of the top surface of a substrate in an oxidation chamber may be less susceptible to crystal plane orientation differences in the substrate upon which it is grown. For example, in one embodiment, the cornering effect caused by differential crystal plane oxidation rates is significantly reduced by forming a dielectric layer in an oxidation chamber of a cluster tool. FIG. 13A illustrates a cross-sectional view of a substrate including first and second exposed crystal planes, in accordance with an embodiment of the present invention.

Referring to FIG. 13A, a substrate 1300 has isolation regions 1302 formed thereon. Substrate 1300 may be composed of a material described in association with substrate 1000 from FIG. 10A. Isolation regions 1302 may be composed of an insulating material suitable for adhesion to substrate 1300. An exposed portion of substrate 1300 extends above the top surface of isolation regions 1302. In accordance with an embodiment of the present invention, the exposed portion of substrate 1300 has a first exposed crystal plane 1304 and a second exposed crystal plane 1306. In one embodiment, the crystal orientation of first exposed crystal plane 1304 is different from the crystal orientation of second exposed crystal plane 1306. In a specific embodiment, substrate 1300 is composed of silicon, first exposed crystal plane 1304 has <100> orientation, and second exposed crystal plane 1306 has <110> orientation.

Figure 13B:
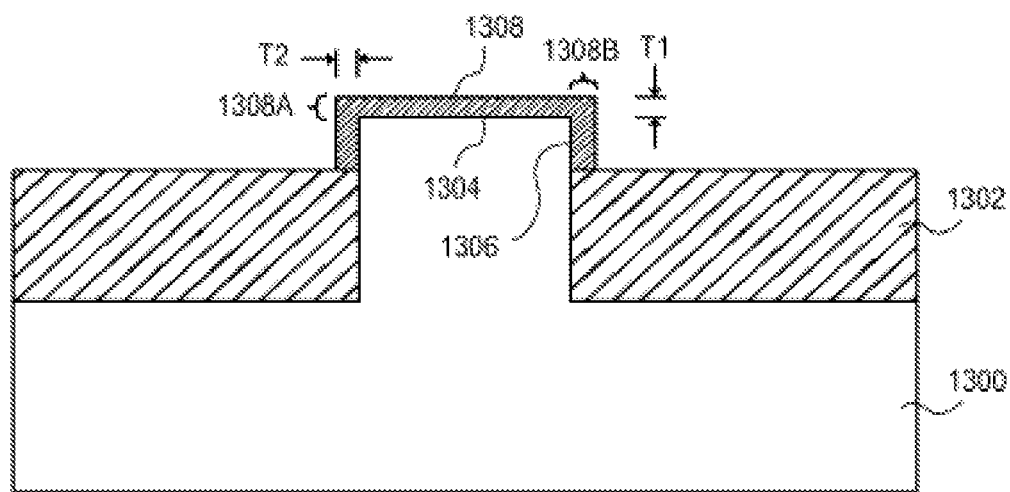
FIG. 13B illustrates a cross-sectional view of the substrate including first and second crystal planes and having a dielectric layer formed thereon, in accordance with an embodiment of the present invention.

Substrate 1300 may be subjected to a radical oxidation process in a cluster tool to form a dielectric layer by consuming (oxidizing) the top surface of substrate 1300. In one embodiment, the oxidizing of substrate 1300 by a radical oxidation process includes oxidizing with a radical selected from the group consisting of an OH radical, an HO2 radical or an O diradical. FIG. 13B illustrates a cross-sectional view of substrate 1300 including first and second crystal planes 1304 and 1306, respectively, and having a dielectric layer 1308 formed thereon, in accordance with an embodiment of the present invention. In an embodiment, first portion 1308A of dielectric layer 1308 is formed on first exposed crystal plane 1304 and a second portion 1308B of dielectric layer 1308 is formed on second exposed crystal plane 1306, as depicted in FIG. 13B. In one embodiment, the thickness T1 of first portion 1308A of dielectric layer 1308 is approximately equal to the thickness T2 of second portion 1308B of dielectric layer 1308, even though the crystal plane orientation of first exposed crystal plane 1304 and second exposed crystal plane 1306 differ. In a specific embodiment, the radical oxidation of substrate 1300 is carried out at a temperature approximately in the range of 950-1100 degrees Celsius at a pressure approximately in the range of 5-15 Torr. In one embodiment, subsequent to forming dielectric layer 1308, substrate 1300 is annealed in the oxidation chamber in an atmosphere including nitrogen at a temperature approximately in the range of 900-1100 degrees Celsius for a duration approximately in the range of 30 seconds-60 seconds.

Implementations and Alternatives

Figure 14:
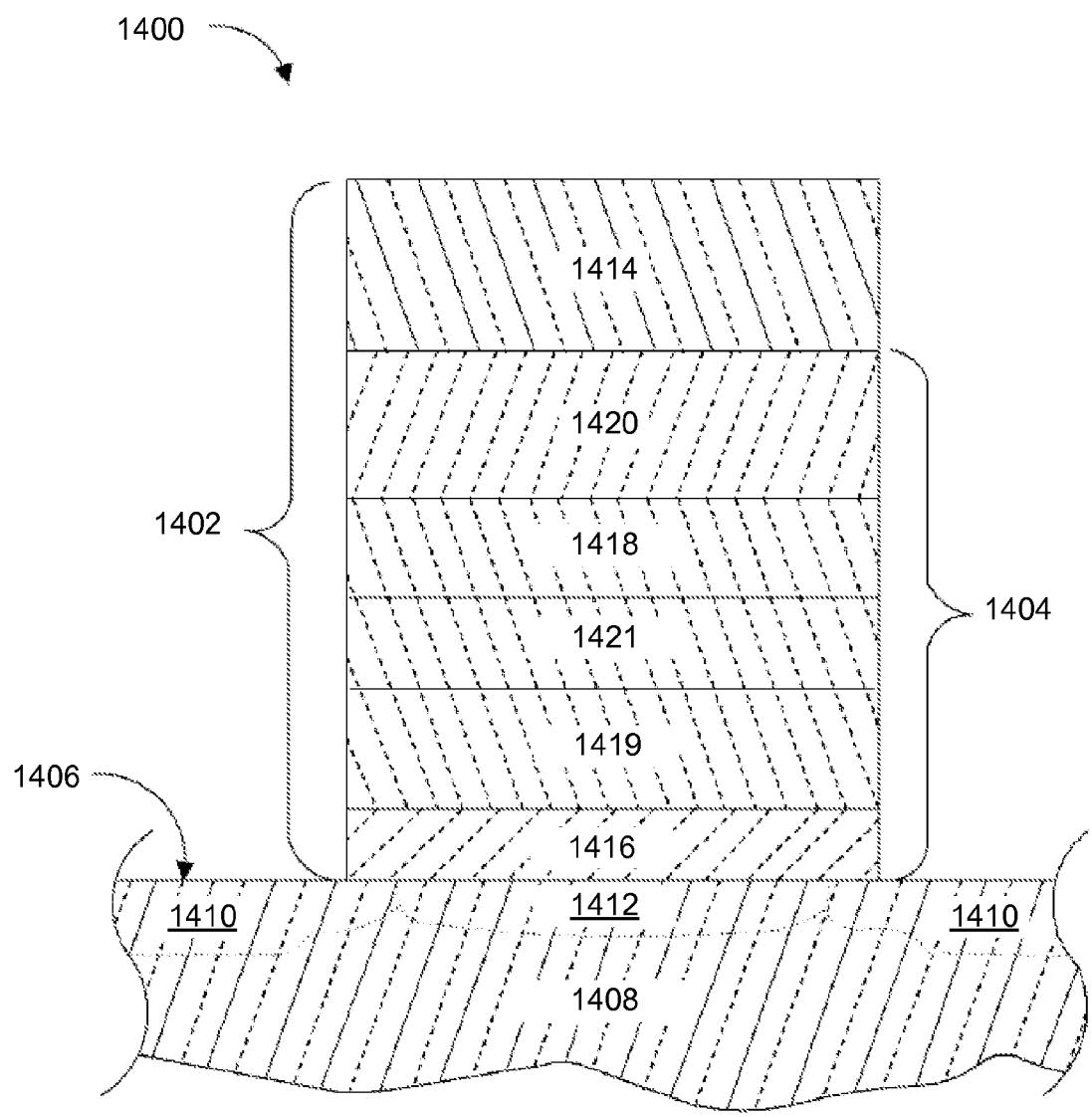
FIG. 14 illustrates a cross-sectional view of a nonvolatile charge trap memory device including an ONONO stack.

In one aspect the present disclosure is directed to memory devices including an oxide split multi-layer charge storing structure. FIG. 14 is a block diagram illustrating a cross-sectional side view of an embodiment of one such semiconductor memory device 1400. The memory device 1400 includes a SONONOS stack 1402 including an ONONO structure 1404 formed over a surface 1406 of a substrate 1408. Substrate 1408 includes one or more diffusion regions 1410, such as source and drain regions, aligned to the gate stack 1402 and separated by a channel region 1412. Generally, the SONONOS structure 1402 includes a polysilicon or metal gate layer 1414 formed upon and in contact with the ONONO structure 1404. The gate 1414 is separated or electrically isolated from the substrate 1408 by the ONONO structure 1404. The ONONO structure 1404 includes a thin, lower oxide layer or tunneling oxide layer 1416 that separates or electrically isolates the stack 1402 from the channel region 1412, a top or blocking oxide layer 1420, and a multi-layer charge storing layer 1404. The multi-layer charge storing layer generally includes at least two nitride layers having differing compositions of silicon, oxygen and nitrogen, including a silicon-rich, nitrogen-rich, and oxygen-lean top nitride layer 1418, a silicon-rich, oxygen-rich, the bottom nitride layer 1419, and an oxide, anti-tunneling layer 1421.

It has been found that a silicon-rich, oxygen-rich, bottom nitride layer 1419 decreases the charge loss rate after programming and after erase, which is manifested in a small voltage shift in the retention mode, while a silicon-rich, nitrogen-rich, and oxygen-lean top nitride layer 1418 improves the speed and increases of the initial difference between program and erase voltage without compromising a charge loss rate of memory devices made using an embodiment of the silicon-oxide-oxynitride-oxide-silicon structure, thereby extending the operating life of the device.

It has further been found that the anti-tunneling layer 1421 substantially reduces the probability of electron charge that accumulates at the boundaries of the upper nitride layer 1418 during programming from tunneling into the bottom nitride layer 1419, resulting in lower leakage current than for the structure illustrated in FIG. 1.

The multi-layer charge storing layer can have an overall thickness of from about 50 Å to about 150 Å, and in certain embodiments less than about 100 Å, with the with the thickness of the anti-tunneling layer 1421 being from about 5 Å to about 20 Å, and the thicknesses of the nitride layers 1418, 1419, being substantially equal.

A method or forming or fabricating a split multi-layer charge storing structure according to one embodiment will now be described with reference to the flowchart of FIG. 15.

Figure 15:
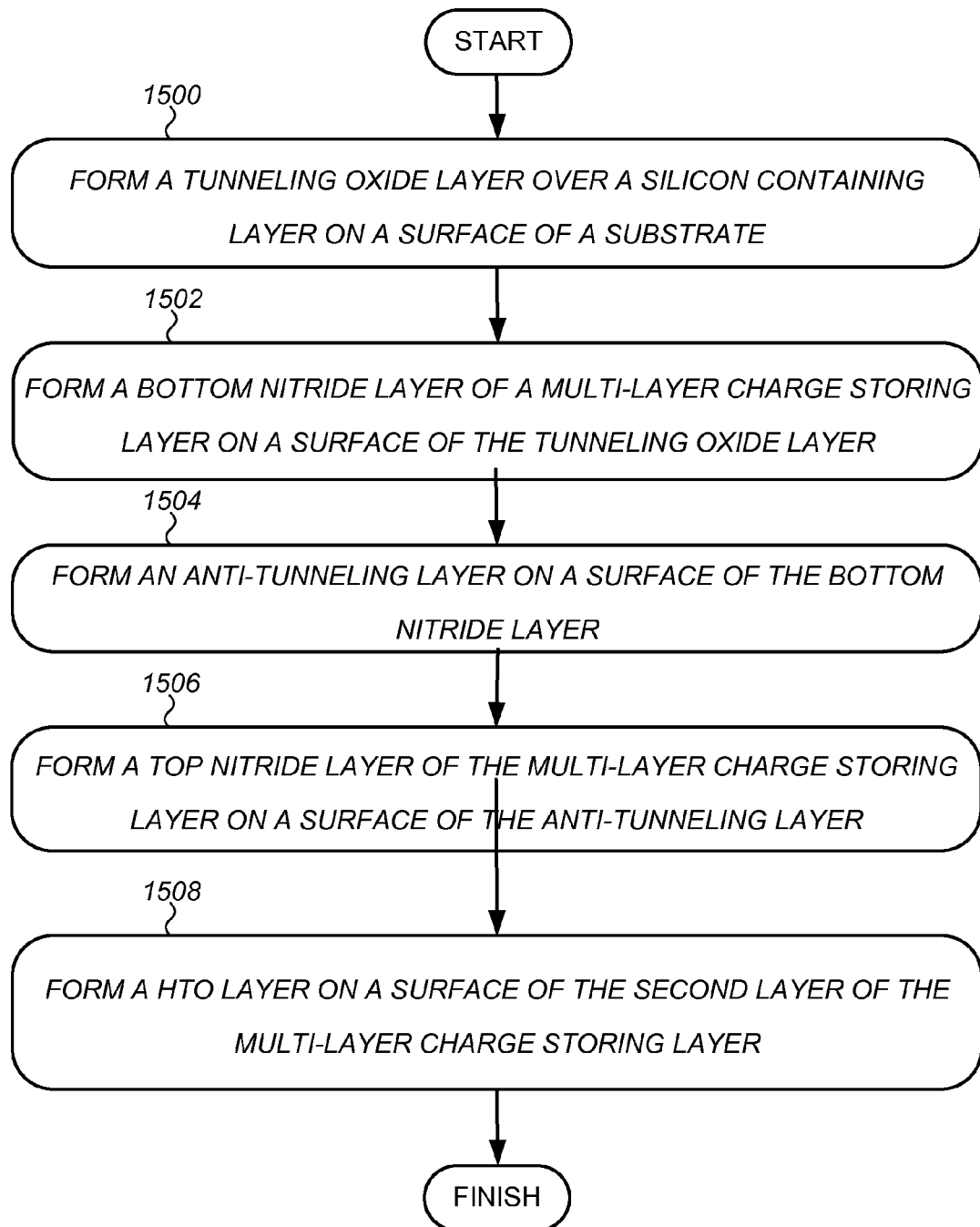
FIG. 15 depicts a Flowchart representing a series of operations in a method for fabricating a nonvolatile charge trap memory device including an ONONO stack, in accordance with an embodiment of the present invention.

Referring to FIG. 15, the method begins with forming a first oxide layer, such as a tunneling oxide layer, over a silicon containing layer on a surface of a substrate (1500). As noted above, the tunneling oxide layer can be formed or deposited by any suitable means, including a plasma oxidation process, In-Situ Steam Generation (ISSG) or a radical oxidation process. In one embodiment, the radical oxidation process involves flowing hydrogen ($H_2$) and oxygen ($O_2$) gas into a processing chamber or furnace to effect growth of a the tunneling oxide layer by oxidation consumption of a portion of the substrate.

Next, the first or bottom nitride or nitride containing layer of the multi-layer charge storing layer is formed on a surface of the tunneling oxide layer (1502). In one embodiment, the nitride layers are formed or deposited in a low pressure CVD process using a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or bottom nitride layer can be deposited over the tunneling oxide layer by placing the substrate in a deposition chamber and introducing a process gas including $N_2O$, $NH_3$ and DCS, while maintaining the chamber at a pressure of from about 5 milliTorr (mT) to about 500 mT, and maintaining the substrate at a temperature of from about 700 degrees Celsius to about 850 degrees Celsius and in certain embodiments at least about 760 degrees Celsius, for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, bottom nitride layer.

Next, the anti-tunneling layer is formed or deposited on a surface of the bottom nitride layer (1504). As with the tunneling oxide layer, the anti-tunneling layer can be formed or deposited by any suitable means, including a plasma oxidation process, In-Situ Steam Generation (ISSG) or a radical oxidation process. In one embodiment, the radical oxidation process involves flowing hydrogen ($H_2$) and oxygen ($O_2$) gas into a batch-processing chamber or furnace to effect growth of the anti-tunneling layer by oxidation consumption of a portion of the bottom nitride layer.

The second or top nitride layer of the multi-layer charge storing layer is then formed on a surface of the anti-tunneling layer (1506). The top nitride layer can be deposited over the anti-tunneling layer 1421 in a CVD process using a process gas including $N_2O$, $NH_3$ and DCS, at a chamber pressure of from about 5 mT to about 500 mT, and at a substrate temperature of from about 700 degrees Celsius to about 850 degrees Celsius and in certain embodiments at least about 760 degrees Celsius, for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean top nitride layer 1418, which improves the speed and increases of the initial difference between program and erase voltage without compromising a charge loss rate of memory devices made using an embodiment of the silicon-oxide-oxynitride-oxide-silicon structure, thereby extending the operating life of the device.

In some embodiments, the silicon-rich, nitrogen-rich, and oxygen-lean top nitride layer can be deposited over the anti-tunneling layer in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

Finally, a top, blocking oxide layer or HTO layer is formed on a surface of the second layer of the multi-layer charge storing layer (1508). As with the tunneling oxide layer and the anti-tunneling layer the HTO layer can be formed or deposited by any suitable means, including a plasma oxidation process, In-Situ Steam Generation (ISSG) or a radical oxidation process. In one embodiment, the HTO layer is formed using a plasma oxidation performed in a plasma process chamber. Typical deposition conditions used for this process are—R.F power in the range 1500 W to 10000W, H2 and O2 with H2 volume percent between 0% and 90%, substrate temperature between 300 C to 400 C, deposition time being 20 to 60 sec Alternatively, the HTO layer is formed using an ISSG oxidation process. In one embodiment, the ISSG is performed in an RTP chamber, such as the ISSG chamber from Applied Materials described above, at pressures of from about 8 to 12 Torr and a temperature of about 1050° C. with an oxygen rich gas mixture hydrogen to which from about 0.5% to 33% hydrogen has been added. The deposition time is in the range 20 to 60 sec.

It will be appreciated that in either embodiment the thickness of the top nitride layer may be adjusted or increased as some of the top nitride layer will be effectively consumed or oxidized during the process of forming the HTO layer.

Optionally, the method may further include forming or depositing a metal or polysilicon containing layer on a surface of the HTO layer to form a gate layer of the transistor or device (1508). The gate layer can be, for example, a polysilicon layer deposited by a CVD process to form a silicon-oxide-nitride-oxide-nitride-oxide-silicon (SONOS) structure.

In another aspect the present disclosure is also directed to multigate or multigate-surface memory devices including charge-trapping regions overlying two or more sides of a channel formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 16A:
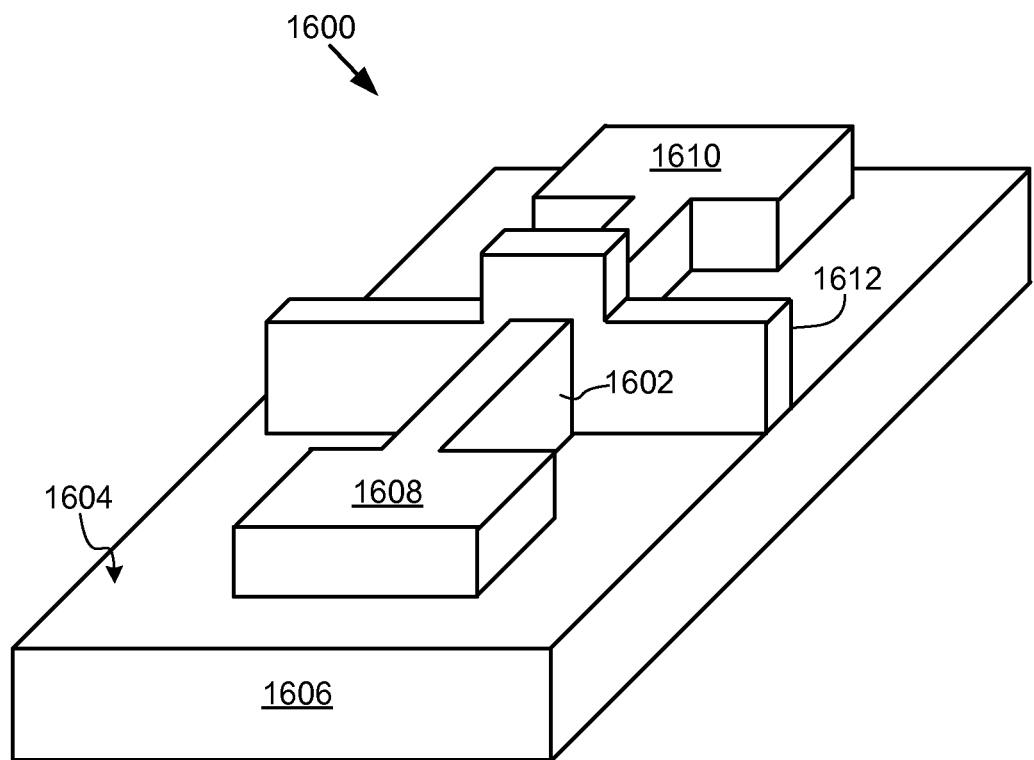
FIG. 16A illustrates a non-planar multigate device including a split charge-trapping region.

FIG. 16A illustrates one embodiment of a non-planar multigate memory device including a charge-trapping region. Referring to FIG. 16A, the memory device 1600, commonly referred to as a finFET, includes a channel 1602 formed from a thin film or layer of semiconducting material overlying a surface 1604 on a substrate 1606 connecting a source 1608 and a drain 1610 of the memory device. The channel 1602 is enclosed on three sides by a fin which forms a gate 1612 of the device. The thickness of the gate 1612 (measured in the direction from source to drain) determines the effective channel length of the device.

Figure 16B:
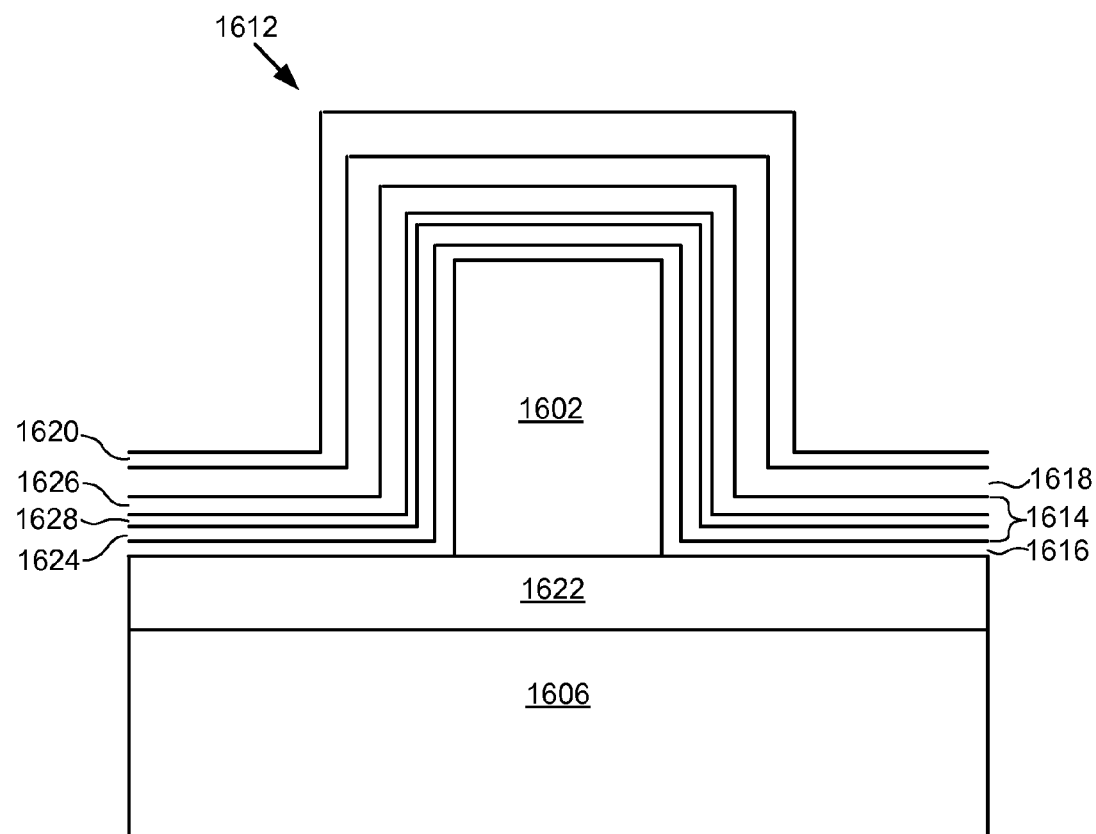
FIG. 16B illustrates a cross-sectional view of the non-planar multigate device of FIG. 16A.

In accordance with the present disclosure, the non-planar multigate memory device 1600 of FIG. 16A can include a split charge-trapping region. FIG. 16B is a cross-sectional view of a portion of the non-planar memory device of FIG. 16A including a portion of the substrate 1606, channel 1602 and the gate 1612 illustrating a multi-layer charge storing layer 1614. The gate 1612 further includes a tunnel oxide layer 1616 overlying a raised channel 1602, a blocking dielectric 1618 and a metal gate layer 1620 overlying the blocking layer to form a control gate of the memory device 1600. In some embodiments a doped polysilicon may be deposited instead of metal to provide a polysilicon gate layer. The channel 1602 and gate 1612 can be formed directly on substrate 1606 or on an insulating or dielectric layer 1622, such as a buried oxide layer, formed on or over the substrate.

Referring to FIG. 16B, the multi-layer charge storing layer 1614 includes at least one lower or bottom charge-trapping layer 1624 including nitride closer to the tunnel oxide layer 1616, and an upper or top charge-trapping layer 1626 overlying the bottom charge-trapping layer. Generally, the top charge-trapping layer 1626 includes a silicon-rich, oxygen-lean nitride layer and includes a majority of a charge traps distributed in multiple charge-trapping layers, while the bottom charge-trapping layer 1624 includes an oxygen-rich nitride or silicon oxynitride, and is oxygen-rich relative to the top charge-trapping layer to reduce the number of charge traps therein. By oxygen-rich it is meant wherein a concentration of oxygen in the bottom charge-trapping layer 1624 is from about 15 to about 40%, whereas a concentration of oxygen in top charge-trapping layer 1626 is less than about 5%.

In one embodiment, the blocking dielectric 1618 also includes an oxide, such as an HTO, to provide an ONNO structure. The channel 1602 and the overlying ONNO structure can be formed directly on a silicon substrate 1606 and overlaid with a doped polysilicon gate layer 1620 to provide a SONNOS structure.

In some embodiments, such as that shown in FIG. 16B, the multi-layer charge storing layer 1614 further includes at least one thin, intermediate or anti-tunneling layer 1628 including a dielectric, such as an oxide, separating the top charge-trapping layer 1626 from the bottom charge-trapping layer 1624. As noted above, the anti-tunneling layer 1628 substantially reduces the probability of electron charge that accumulates at the boundaries of the upper nitride layer 1626 during programming from tunneling into the bottom nitride layer 1624.

As with the embodiments described above, either or both of the bottom charge-trapping layer 1624 and the top charge-trapping layer 1626 can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The top charge-trapping layer 1626 has a stoichiometric composition of oxygen, nitrogen and/or silicon different from that of the bottom charge-trapping layer 1624, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1628 including oxide, the anti-tunneling layer can be formed by oxidation of the bottom oxynitride layer, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Torr for a batch process, or 10-15 Torr using a single vapor tool, for a time of 1-2 minutes using a single wafer tool, or 30 min −1 hour using a batch process.

Finally, in those embodiments including a blocking dielectric 1618 including oxide the oxide may be formed or deposited by any suitable means. In one embodiment the oxide of the blocking dielectric 1618 is a high temperature oxide deposited in a HTO CVD process. Alternatively, the blocking dielectric 1618 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

A suitable thickness for the bottom charge-trapping layer 1624 may be from about 30 Å to about 160 Å (with some variance permitted, for example ±10 A), of which about 5-20 Å may be consumed by radical oxidation to form the anti-tunneling layer 1628. A suitable thickness for the top charge-trapping layer 1626 may be at least 30 Å. In certain embodiments, the top charge-trapping layer 1626 may be formed up to 130 Å thick, of which 30-70 Å may be consumed by radical oxidation to form the blocking dielectric 1618. A ratio of thicknesses between the bottom charge-trapping layer 1624 and top charge-trapping layer 1626 is approximately 1:1 in some embodiments, although other ratios are also possible.

In other embodiments, either or both of the top charge-trapping layer 1626 and the blocking dielectric 1618 may include a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Figure 17A:
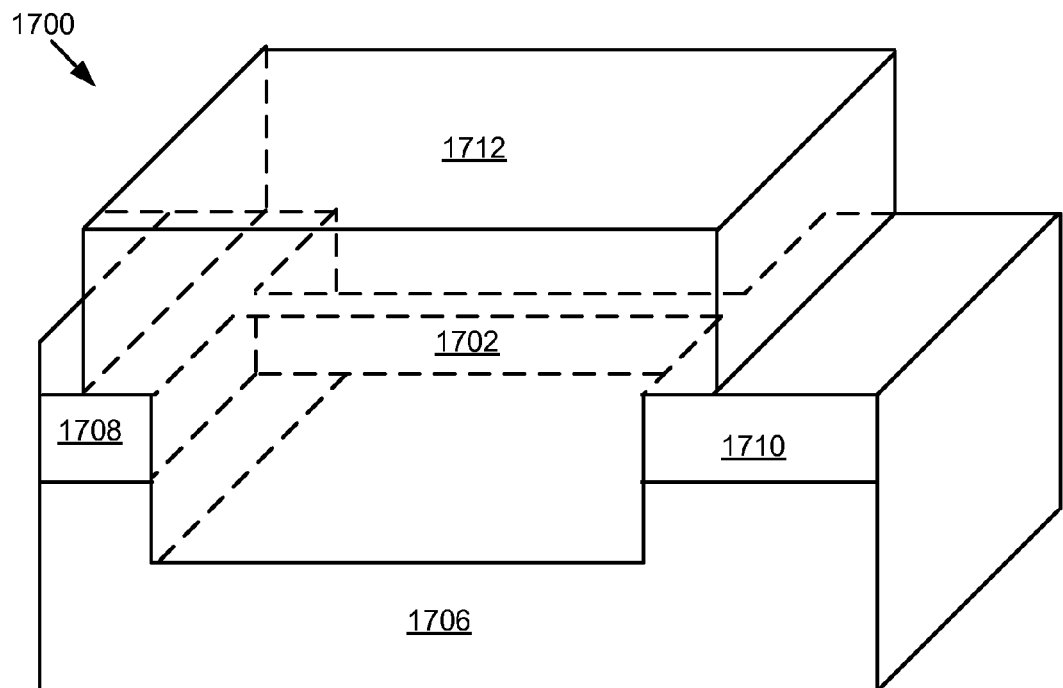
FIGS. 17A and 17B illustrate a non-planar multigate device including a split charge-trapping region and a horizontal nanowire channel.
Figure 17B:
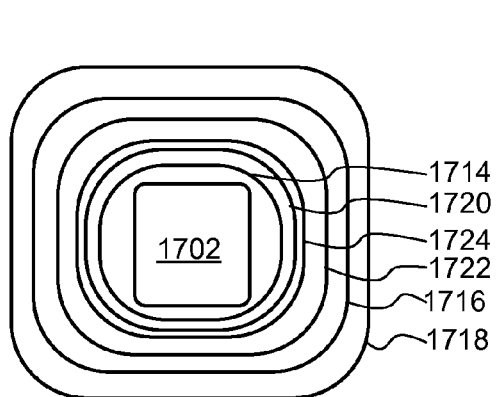

In another embodiment, shown in FIGS. 17A and 17B, the memory device can include a nanowire channel formed from a thin film of semiconducting material overlying a surface on a substrate connecting a source and a drain of the memory device. By nanowire channel it is meant a conducting channel formed in a thin strip of crystalline silicon material, having a maximum cross-sectional dimension of about 10 nanometers (nm) or less, and more preferably less than about 6 nm. Optionally, the channel can be formed to have <100> surface crystalline orientation relative to a long axis of the channel.

Referring to FIG. 17A, the memory device 1700 includes a horizontal nanowire channel 1702 formed from a thin film or layer of semiconducting material on or overlying a surface on a substrate 1706, and connecting a source 1708 and a drain 1710 of the memory device. In the embodiment shown, the device has a gate-all-around (GAA) structure in which the nanowire channel 1702 is enclosed on all sides by a gate 1712 of the device. The thickness of the gate 1712 (measured in the direction from source to drain) determines the effective channel length of the device.

In accordance with the present disclosure, the non-planar multigate memory device 1700 of FIG. 17A can include a split charge-trapping region. FIG. 17B is a cross-sectional view of a portion of the non-planar memory device of FIG. 17A including a portion of the substrate 1706, nanowire channel 1702 and the gate 1712 illustrating a split charge-trapping region. Referring to FIG. 17B, the gate 1712 includes a tunnel oxide 1714 overlying the nanowire channel 1702, a split charge-trapping region, a blocking dielectric 1716 and a gate layer 1718 overlying the blocking layer to form a control gate of the memory device 1700. The gate layer 1718 can comprise a metal or a doped polysilicon. The split charge-trapping region includes at least one inner charge-trapping layer 1720 comprising nitride closer to the tunnel oxide 1714, and an outer charge-trapping layer 1722 overlying the inner charge-trapping layer. Generally, the outer charge-trapping layer 1722 comprises a silicon-rich, oxygen-lean nitride layer and comprises a majority of a charge traps distributed in multiple charge-trapping layers, while the inner charge-trapping layer 1720 comprises an oxygen-rich nitride or silicon oxynitride, and is oxygen-rich relative to the outer charge-trapping layer to reduce the number of charge traps therein.

In some embodiments, such as that shown, the split charge-trapping region further includes at least one thin, intermediate or anti-tunneling layer 1724 comprising a dielectric, such as an oxide, separating outer charge-trapping layer 1722 from the inner charge-trapping layer 1720. The anti-tunneling layer 1724 substantially reduces the probability of electron charge that accumulates at the boundaries of outer charge-trapping layer 1722 during programming from tunneling into the inner charge-trapping layer 1720, resulting in lower leakage current.

As with the embodiment described above, either or both of the inner charge-trapping layer 1720 and the outer charge-trapping layer 1722 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The outer charge-trapping layer 1722 has a stoichiometric composition of oxygen, nitrogen and/or silicon different from that of the inner charge-trapping layer 1720, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1724 comprising oxide, the anti-tunneling layer can be formed by oxidation of the inner charge-trapping layer 1720, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Torr for a batch process, or 10-15 Torr using a single vapor tool, for a time of 1-2 minutes using a single wafer tool, or 30 min −1 hour using a batch process.

Finally, in those embodiments in which the blocking dielectric 1716 comprises oxide, the oxide may be formed or deposited by any suitable means. In one embodiment the oxide of blocking dielectric 1716 is a high temperature oxide deposited in a HTO CVD process. Alternatively, the blocking dielectric 1716 or blocking oxide layer may be thermally grown, however it will be appreciated that in this embodiment the thickness of the outer charge-trapping layer 1722 may need to be adjusted or increased as some of the top nitride will be effectively consumed or oxidized during the process of thermally growing the blocking oxide layer.

A suitable thickness for the inner charge-trapping layer 1720 may be from about 30 Å to about 80 Å (with some variance permitted, for example ±10 A), of which about 5-20 Å may be consumed by radical oxidation to form the anti-tunneling layer 1724. A suitable thickness for the outer charge-trapping layer 1722 may be at least 30 Å. In certain embodiments, the outer charge-trapping layer 1722 may be formed up to 170 Å thick, of which 30-70 Å may be consumed by radical oxidation to form the blocking dielectric 1716. A ratio of thicknesses between the inner charge-trapping layer 1720 and the outer charge-trapping layer 1722 is approximately 1:1 in some embodiments, although other ratios are also possible.

In other embodiments, either or both of the outer charge-trapping layer 1722 and the blocking dielectric 1716 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Figure 17C:
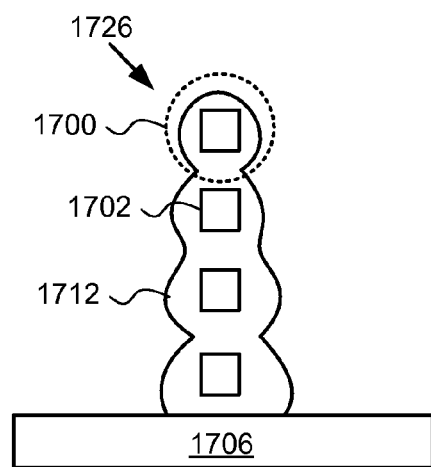
FIG. 17C illustrates a cross-sectional view of a vertical string of non-planar multigate devices of FIG. 17A.

FIG. 17C illustrates a cross-sectional view of a vertical string of non-planar multigate devices 1700 of FIG. 17A arranged in a Bit-Cost Scalable or BiCS architecture 1726. The architecture 1726 consists of a vertical string or stack of non-planar multigate devices 1700, where each device or cell includes a channel 1702 overlying the substrate 1706, and connecting a source and a drain (not shown in this figure) of the memory device, and having a gate-all-around (GAA) structure in which the nanowire channel 1702 is enclosed on all sides by a gate 1712. The BiCS architecture reduces number of critical lithography steps compared to a simple stacking of layers, leading to a reduced cost per memory bit.

In another embodiment, the memory device is or includes a non-planar device comprising a vertical nanowire channel formed in or from a semiconducting material projecting above or from a number of conducting, semiconducting layers on a substrate. In one version of this embodiment, shown in cut-away in FIG. 18A, the memory device 1800 comprises a vertical nanowire channel 1802 formed in a cylinder of semiconducting material connecting a source 1804 and drain 1806 of the device. The channel 1802 is surrounded by a tunnel oxide 1808, a charge-trapping region 1810, a blocking layer 1812 and a gate layer 1814 overlying the blocking layer to form a control gate of the memory device 1800. The channel 1802 can include an annular region in an outer layer of a substantially solid cylinder of semiconducting material, or can include an annular layer formed over a cylinder of dielectric filler material. As with the horizontal nanowires described above, the channel 1802 can comprise polysilicon or recrystallized polysilicon to form a monocrystalline channel. Optionally, where the channel 1802 includes a crystalline silicon, the channel can be formed to have <100> surface crystalline orientation relative to a long axis of the channel.

Figure 18A:
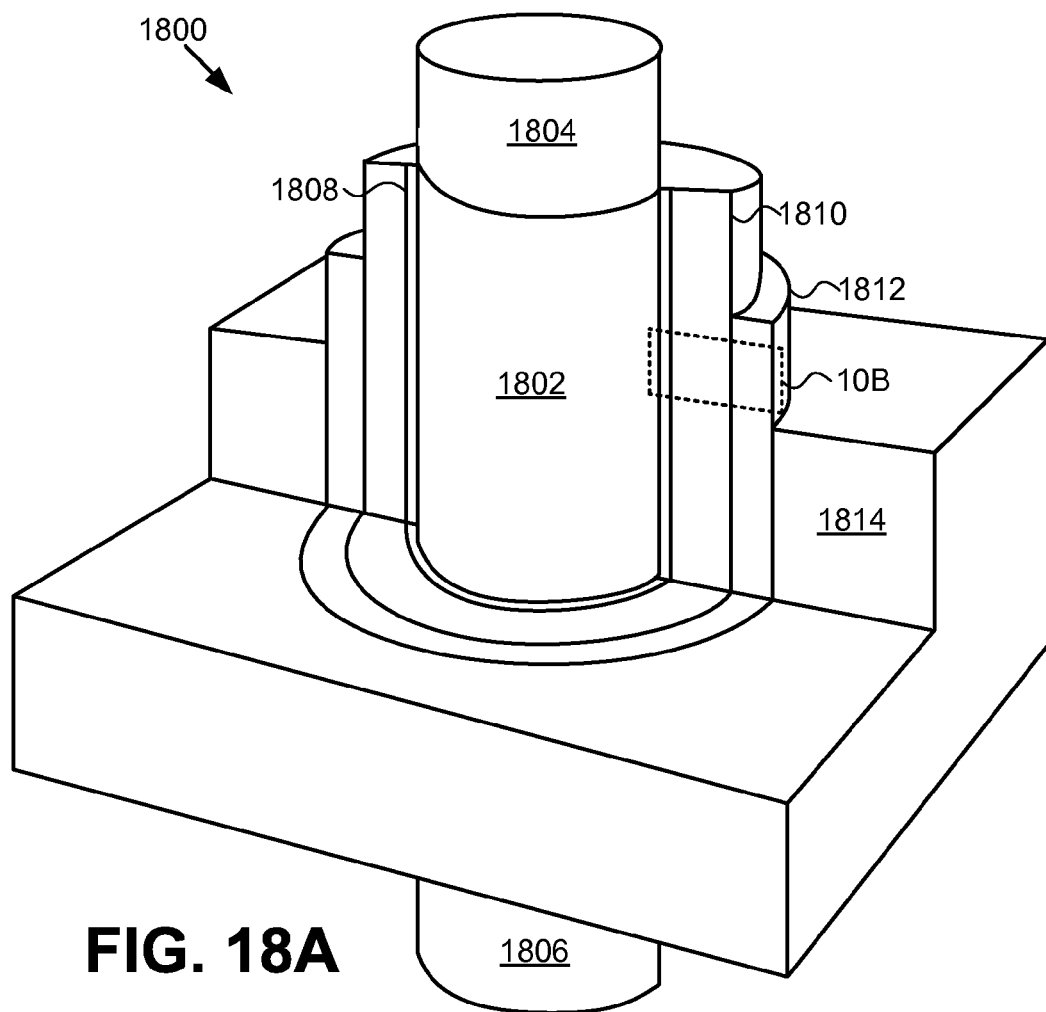
FIGS. 18A and 18B illustrate a non-planar multigate device including a split charge-trapping region and a vertical nanowire channel.
Figure 18B:
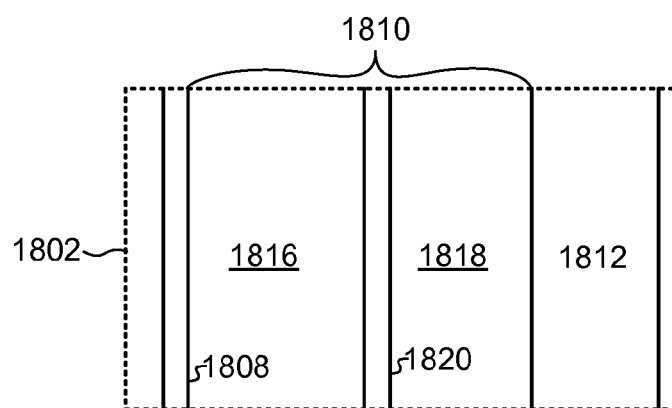

In some embodiments, such as that shown in FIG. 18B, the charge-trapping region 1810 can be a split charge-trapping region including at least a first or inner charge trapping layer 1816 closest to the tunnel oxide 1808, and a second or outer charge trapping layer 1818. Optionally, the first and second charge trapping layers can be separated by an intermediate oxide or anti-tunneling layer 1820.

As with the embodiments described above, either or both of the first charge trapping layer 1816 and the second charge trapping layer 1818 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer.

Finally, either or both of the second charge trapping layer 1818 and the blocking layer 1812 may comprise a high K dielectric, such as HfSiON, HfSiO, HfO, ZrSiON, ZrSiO, ZrO, or $Y_2O_3$.

A suitable thickness for the first charge trapping layer 1816 may be from about 30 Å to about 80 Å (with some variance permitted, for example ±10 A), of which about 5-20 Å may be consumed by radical oxidation to form the anti-tunneling layer 1820. A suitable thickness for the second charge trapping layer 1818 may be at least 30 Å, and a suitable thickness for the blocking dielectric 1812 may be from about 30-70 Å.

The memory device 1800 of FIG. 18A can be made using either a gate first or a gate last scheme. FIGS. 19A-F illustrate a gate first scheme for fabricating the non-planar multigate device of FIG. 18A. FIGS. 20A-F illustrate a gate last scheme for fabricating the non-planar multigate device of FIG. 18A.

Figure 19A:
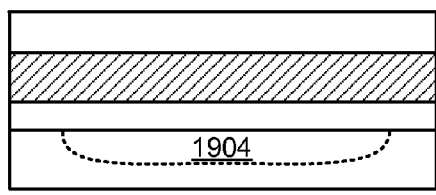
FIG. 19A through 19F illustrate a gate first scheme for fabricating the non-planar multigate device of FIG. 18A.

Referring to FIG. 19A, in a gate first scheme a first or lower dielectric layer 1902, such as a blocking oxide, is formed over a first, doped diffusion region 1904, such as a source or a drain, in a substrate 1906. A gate layer 1908 is deposited over the first dielectric layer 1902 to form a control gate of the device, and a second or upper dielectric layer 1910 formed thereover. As with embodiments described above, the first and second dielectric layers 1902, 1910, can be deposited by CVD, radical oxidation or be formed by oxidation of a portion of the underlying layer or substrate. The gate layer 1908 can comprise a metal deposited or a doped polysilicon deposited by CVD. Generally the thickness of the gate layer 1908 is from about 40-50 Å, and the first and second dielectric layers 1902, 1910, from about 20-80 Å.

Figure 19B:
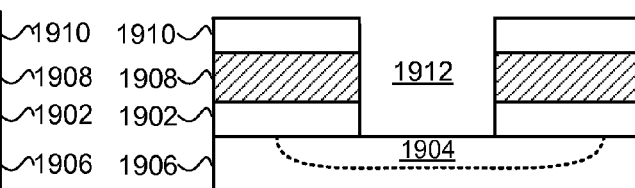
Figure 19C:
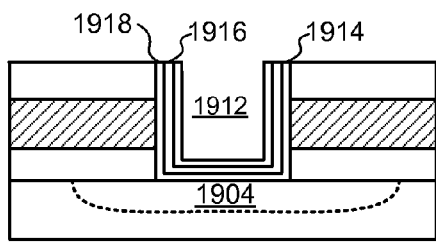

Referring to FIG. 19B, a first opening 1912 is etched through the overlying gate layer 1908, and the first and second dielectric layers 1902, 1910, to the diffusion region 1904 in the substrate 1906. Next, layers of a tunneling oxide 1914, charge-trapping region 1916, and blocking dielectric 1918 are sequentially deposited in the opening and the surface of the upper dielectric layer 1910 planarize to yield the intermediate structure shown in FIG. 19C.

Although not shown, it will be understood that as in the embodiments described above the charge-trapping region 1916 can include a split charge-trapping region comprising at least one lower or bottom charge-trapping layer closer to the tunnel oxide 1914, and an upper or top charge-trapping layer overlying the bottom charge-trapping layer. Generally, the top charge-trapping layer comprises a silicon-rich, oxygen-lean nitride layer and comprises a majority of a charge traps distributed in multiple charge-trapping layers, while the bottom charge-trapping layer comprises an oxygen-rich nitride or silicon oxynitride, and is oxygen-rich relative to the top charge-trapping layer to reduce the number of charge traps therein. In some embodiments, the split charge-trapping region 1916 further includes at least one thin, intermediate or anti-tunneling layer comprising a dielectric, such as an oxide, separating the top charge-trapping layer from the bottom charge-trapping layer.

Figure 19D:
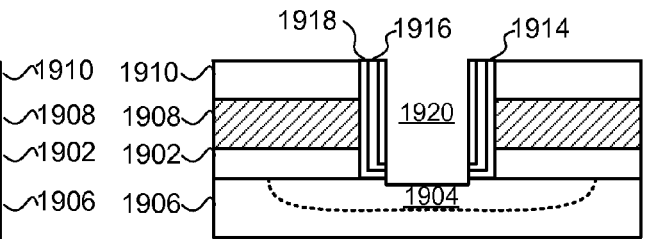
Figure 19E:
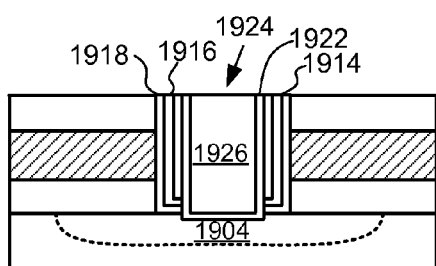

Next, a second or channel opening 1920 is anisotropically etched through tunneling oxide 1914, charge-trapping region 1916, and blocking dielectric 1918, FIG. 19D. Referring to FIG. 19E, a semiconducting material 1922 is deposited in the channel opening to form a vertical channel 1924 therein. The vertical channel 1924 can include an annular region in an outer layer of a substantially solid cylinder of semiconducting material, or, as shown in FIG. 19E, can include a separate, layer semiconducting material 1922 surrounding a cylinder of dielectric filler material 1926.

Figure 19F:
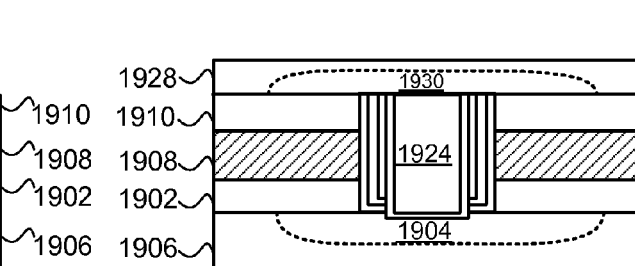

Referring to FIG. 19F, the surface of the upper dielectric layer 1910 is planarized and a layer of semiconducting material 1928 including a second, doped diffusion region 1930, such as a source or a drain, formed therein deposited over the upper dielectric layer to form the device shown.

Figure 20A:
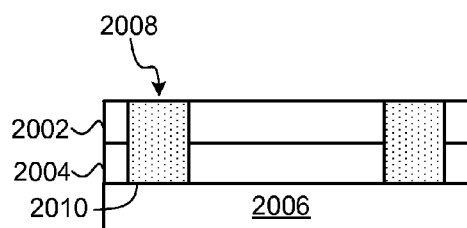
FIG. 20A through 20F illustrate a gate last scheme for fabricating the non-planar multigate device of FIG. 18A.

Referring to FIG. 20A, in a gate last scheme a dielectric layer 2002, such as an oxide, is formed over a sacrificial layer 2004 on a surface on a substrate 2006, an opening etched through the dielectric and sacrificial layers and a vertical channel 2008 formed therein. As with embodiments described above, the vertical channel 2008 can include an annular region in an outer layer of a substantially solid cylinder of semiconducting material 2010, such as polycrystalline or monocrystalline silicon, or can include a separate, layer semiconducting material surrounding a cylinder of dielectric filler material (not shown). The dielectric layer 2002 can comprise any suitable dielectric material, such as a silicon oxide, capable of electrically isolating the subsequently formed gate layer of the memory device 1800 from an overlying electrically active layer or another memory device. The sacrificial layer 2004 can comprise any suitable material that can be etched or removed with high selectivity relative to the material of the dielectric layer 2002, substrate 2006 and vertical channel 2008.

Figure 20B:
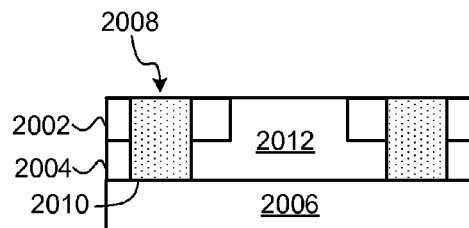

Referring to FIG. 20B, a second opening 2012 is etched through the etched through the dielectric and sacrificial layers 2002, 2004, to the substrate 1906, and the sacrificial layer 2004 etched or removed. The sacrificial layer 2004 can comprise any suitable material that can be etched or removed with high selectivity relative to the material of the dielectric layer 2002, substrate 2006 and vertical channel 2008. In one embodiment the sacrificial layer 2004 comprises that can be removed by Buffered Oxide Etch (BOE etch).

Figure 20C:
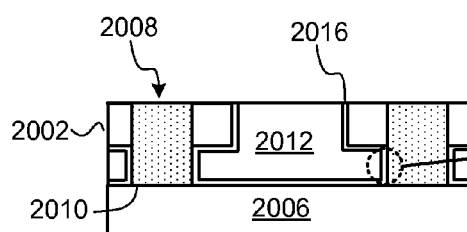
Figure 20D:
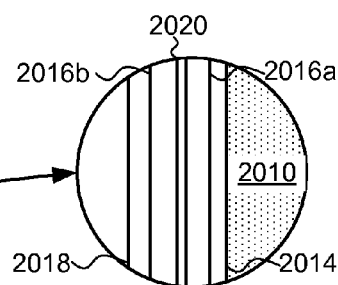

Referring to FIGS. 20C and 20D, layers of a tunneling oxide 2014, charge-trapping region 2016, and blocking dielectric 2018 are sequentially deposited in the opening and the surface of the dielectric layer 2002 planarize to yield the intermediate structure shown in FIG. 20C. In some embodiments, such as that shown in FIG. 20D, the charge-trapping region 2016 can be a split charge-trapping region including at least a first or inner charge trapping layer 2016*a* closest to the tunnel oxide 2014, and a second or outer charge trapping layer 2016*b*. Optionally, the first and second charge trapping layers can be separated by an intermediate oxide or anti-tunneling layer 2020.

Figure 20E:
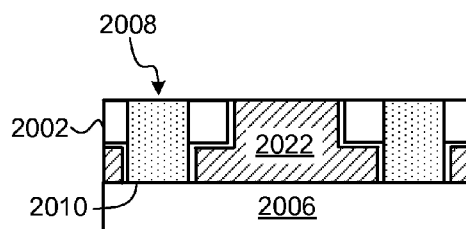
Figure 20F:
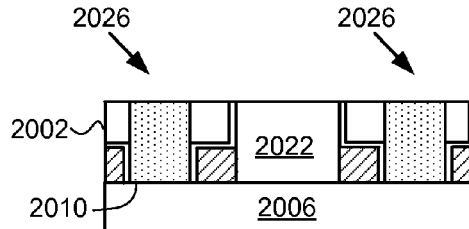

Next, a gate layer 2022 is deposited into the second opening 2012 and the surface of the upper dielectric layer 2002 planarized to yield the intermediate structure illustrated in FIG. 20E. As with embodiments described above, the gate layer 2022 can comprise a metal deposited or a doped polysilicon. Finally, an opening 2024 is etched through the gate layer 2022 to form control gate of separate memory devices 2026.

Thus, a method for fabricating a nonvolatile charge trap memory device has been disclosed. In accordance with an embodiment of the present invention, a substrate is subjected to a first radical oxidation process to form a first dielectric layer in a first process chamber of a cluster tool. A charge-trapping layer may then be deposited above the first dielectric layer in a second process chamber of the cluster tool. In one embodiment, the charge-trapping layer is then subjected to a second radical oxidation process to form a second dielectric layer above the charge-trapping layer by oxidizing a portion of the charge-trapping layer in the first process chamber of the cluster tool. By forming all layers of an oxide-nitride-oxide (ONO) stack in a cluster tool, interface damage may be reduced between the respective layers. Thus, in accordance with an embodiment of the present invention, an ONO stack is fabricated in a single pass in a cluster tool in order to preserve a pristine interface between the layers in the ONO stack. In a specific embodiment, the cluster tool is a single-wafer cluster tool.

What is claimed is:

1. A memory device, comprising:
    a tunnel oxide layer overlying a channel connecting a source and a drain of the memory device formed in a substrate;
    a multi-layer charge storing layer overlying the tunnel oxide layer, the multi-layer charge storing layer comprising an oxygen-rich, first layer comprising a nitride on the tunnel oxide layer in which a composition of the first layer results in it being substantially trap free, and a second layer comprising a Zirconium or Yttrium based high K dielectric material on the first layer in which a composition of the second layer results in it being trap dense; and
    a blocking layer overlying the multi-layer charge storing layer.

2. The memory device of claim 1, wherein the channel comprises polysilicon.

3. The memory device of claim 2, wherein the channel comprises recrystallized polysilicon.

4. The memory device of claim 1, wherein the channel comprises a silicon nanowire.

5. The memory device of claim 1, wherein the first layer of the multi-layer charge storing layer comprises silicon nitride or silicon oxy-nitride.

6. The memory device of claim 1, wherein the first layer is separated from the second layer by an anti-tunneling layer comprising an oxide.

7. The memory device of claim 1, wherein the blocking layer comprises a high-temperature-oxide (HTO).

8. The memory device of claim 1, wherein the blocking layer comprises a Hafnium, Zirconium or Yttrium based high K dielectric material.

9. A device comprising:
    a vertical channel extending from a first diffusion region formed on a surface on a substrate to a second diffusion region formed over the surface of the substrate, the vertical channel electrically connecting the first diffusion region to the second diffusion region; and an oxide-nitride-nitride-oxide (ONNO) stack disposed about the vertical channel, the ONNO stack comprising:
 a tunnel oxide layer abutting the vertical channel;
 a multi-layer charge storing layer overlying the tunnel oxide layer, the multi-layer charge storing layer comprising an oxygen-rich, first layer comprising a nitride abutting the tunnel oxide layer in which a composition of the first layer results in it being substantially trap free, and an oxygen-lean, silicon nitride second layer overlying the first layer in which a composition of the second layer results in it being trap dense; and
 a high-temperature-oxide (HTO) layer overlying the multi-layer charge storing layer, the HTO layer comprising an oxidized silicon nitride with a thickness approximately in the range of 2 to 3 nanometers, and an oxide overlaying the oxidized silicon nitride.

10. The memory device of claim 9, wherein the channel comprises polysilicon.

11. The memory device of claim 10, wherein the channel comprises recrystallized polysilicon.

12. The memory device of claim 10, wherein the channel comprises a silicon nanowire.

13. The memory device of claim 9, wherein the first layer is separated from the second layer by an anti-tunneling layer comprising an oxide.

14. The memory device of claim 9, wherein the HTO layer further comprises a nitrided HTO layer overlying the oxide of the HTO layer.

* * * * *